United States Patent
Mochizuki et al.

(10) Patent No.: US 7,541,617 B2
(45) Date of Patent: Jun. 2, 2009

(54) RADIATION IMAGE PICKUP DEVICE

(75) Inventors: Chiori Mochizuki, Kanagawa-Ken (JP); Masakazu Morishita, Kanagawa-Ken (JP); Minoru Watanabe, Saitama-Ken (JP); Takamasa Ishii, Saitama-Ken (JP); Keiichi Nomura, Saitama-Ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 365 days.

(21) Appl. No.: 10/538,013

(22) PCT Filed: Feb. 10, 2004

(86) PCT No.: PCT/JP2004/001423

§ 371 (c)(1),
(2), (4) Date: Jun. 7, 2005

(87) PCT Pub. No.: WO2004/073068

PCT Pub. Date: Aug. 26, 2004

(65) Prior Publication Data

US 2006/0249763 A1    Nov. 9, 2006

(30) Foreign Application Priority Data

Feb. 14, 2003   (JP)  ............................ 2003-036832
Feb. 14, 2003   (JP)  ............................ 2003-036833

(51) Int. Cl.
*H01L 27/14* (2006.01)
*H01L 29/04* (2006.01)
*H01L 29/15* (2006.01)
*H01L 31/036* (2006.01)

(52) U.S. Cl. ................. 257/72; 257/444; 257/E31.092; 257/E31.093; 257/E27.133; 257/E27.141; 257/291

(58) Field of Classification Search ............ 250/370.01, 250/370.08, 370.09
See application file for complete search history.

(56) References Cited

U.S. PATENT DOCUMENTS 5,313,075 A    5/1994   Zhang et al. .................. 257/57

(Continued)

FOREIGN PATENT DOCUMENTS

JP    S62-086855    4/1987

(Continued)

OTHER PUBLICATIONS

Mankovich, N.J., et al., "*Application Of A New Pyramidal Segementation Algorithm To Medical Images,*" SPIE Medical Imaging VI: Image Processing, Murray H. Lowe, Editor (Feb. 1992), vol. 1652, pp. 23-30.

(Continued)

*Primary Examiner*—Victor A Mandala
*Assistant Examiner*—Leslie P Cruz
(74) *Attorney, Agent, or Firm*—Fitzpatrick, Cella, Harper & Scinto

(57) ABSTRACT

In a radiation image pickup device including: a sensor element for converting radiation into an electrical signal; and a thin film transistor connected to the sensor element, an electrode of the sensor element connected to the thin film transistor is disposed above the thin film transistor, and that the thin film transistor has a top gate type structure in which a semiconductor layer, a gate insulating layer, and a gate electrode layer are laminated in this order on a substrate, so that a channel portion of the thin film transistor is protected by a gate electrode, thereby providing stable TFT characteristics without undesirable turning ON any of the TFT elements due to the back gate effect by the fluctuation in electric potentials corresponding to outputs from the sensor electrodes, and thereby greatly improving image quality.

14 Claims, 15 Drawing Sheets

U.S. PATENT DOCUMENTS

| | | | |
|---|---|---|---|
| 5,498,880 A | 3/1996 | Lee et al. | 250/580 |
| 6,020,590 A * | 2/2000 | Aggas et al. | 250/370.09 |
| 6,277,679 B1 * | 8/2001 | Ohtani | 438/151 |
| 6,524,877 B1 | 2/2003 | Nakazawa et al. | 438/48 |
| 6,784,949 B1 | 8/2004 | Nagata et al. | |
| 6,847,039 B2 | 1/2005 | Mochizuki | 250/370.09 |
| 2001/0019130 A1 * | 9/2001 | Yamazaki et al. | 257/172 |
| 2001/0038075 A1 | 11/2001 | Morishita | 250/370 |
| 2002/0012057 A1 | 1/2002 | Kimura | |
| 2002/0056810 A1 | 5/2002 | Kobayashi et al. | 250/370 |
| 2003/0020020 A1 | 1/2003 | Kobayashi et al. | 250/370 |
| 2004/0238820 A1 | 12/2004 | Sakama et al. | 257/59 |
| 2005/0274991 A1 | 12/2005 | Ishii et al. | 257/232 |

FOREIGN PATENT DOCUMENTS

| | | |
|---|---|---|
| JP | S62-086857 | 4/1987 |
| JP | S63-172470 | 7/1988 |
| JP | H01-220862 | 9/1989 |
| JP | H02-260460 | 10/1990 |
| JP | H03-185840 | 8/1991 |
| JP | H04-32267 | 2/1992 |
| JP | 63-172470 | 7/1998 |
| JP | H10-313122 | 11/1998 |
| JP | H11-121731 | 4/1999 |
| JP | 11-307756 | 11/1999 |
| JP | 2000-12866 | 1/2000 |
| JP | 2000-12866 A | 1/2000 |
| JP | 2000-156522 | 6/2000 |
| JP | 2000-241557 A | 9/2000 |
| JP | 2000323698 | 11/2000 |
| JP | 2001-053286 | 2/2001 |
| JP | 2001-196597 | 7/2001 |
| JP | 2001-210833 | 8/2001 |
| JP | 2001308306 | 11/2001 |
| JP | 2001-345440 | 12/2001 |
| JP | 2002-26300 | 1/2002 |
| JP | 2002-124655 | 4/2002 |
| JP | 2002231922 | 8/2002 |
| JP | 2002-289824 | 10/2002 |
| JP | 2002-303673 | 10/2002 |
| JP | 2003023144 | 1/2003 |
| WO | WO 2004-073068 A1 | 8/2004 |

OTHER PUBLICATIONS

European Search Report issued Aug. 14, 2007 for Application No, 04709735.7-1235.

Japanese Office Action JP2003-03632 Oct. 24, 2008 with part translation.

Japanese Office Action JP2003-03633 Oct. 24, 2008 with part translation.

Japanese Office Action JP2003-036832 Jan. 27, 2009 with part transition.

Japanese Office Action JP2003-036833 Jan. 27, 2009 with part transition.

* cited by examiner

RADIATION IMAGE PICKUP DEVICE

TECHNICAL FIELD

The present invention relates in general to a radiation image pickup device, and more particularly to a substrate for photoelectric conversion and a photoelectric converter, and a substrate for radiation image pickup and a radiation image pickup device, which are applied to a medical image diagnosis system, a non-destructive inspection system, an analyzer using radiation, or the like. Note that, it is supposed that electromagnetic waves such as visible light, and X-rays, alpha rays, beta rays, gamma rays and the like are included in "radiation" used in this specification. In addition, "a wavelength conversion unit" used in this specification means a unit for wavelength-converting radiation, and is supposed to include a phosphor for converting radiation such as X-rays into an optical signal. Moreover, "a semiconductor conversion element" used in this specification means an element for converting at least radiation into electric charges, and for example, is supposed to include a photoelectric conversion element for converting an optical signal into electric charges.

BACKGROUND ART

In recent years, the technique for TFTs for liquid crystal display devices has progressed, and servicing for information infrastructure has been made satisfactory. Thus, at the present time, a flat panel detector (hereinafter referred to as "an FPD" for short when applicable) is proposed which is obtained by combining a sensor array constituted by photoelectric conversion elements using non-monocrystalline silicon, e.g., amorphous silicon (hereinafter referred to as "a-Si" for short) and switching TFTs with a phosphor for converting radiation into light such as visible light. Also, even in the medical image field, the FPD can have a large area, and digitization of the FPD is attained.

This FPD is adapted to read out a radiation image in an instant to display the radiation image thus read out on a display device simultaneously, and an image can be directly fetched in the form of digital information from the FPD. Thus, the FPD has the feature that handling management is convenient in safekeeping of data, or process and transfer of data. In addition, it was verified that though the characteristics such as sensitivity depend on photographing conditions, the characteristics are equal to or superior to those in a conventional screen film (hereinafter referred to as "S/F" for short) photographing method or a computed radiography (hereinafter referred to as "CR" for short) photographing method.

An equivalent circuit diagram of 1 bit in this FPD is shown in FIG. 10. In addition, a schematic equivalent circuit diagram of (3×3) bits in the FPD is shown in FIG. 11. In these figures, reference numeral 101 and reference symbols S11 to S33 designate photoelectric conversion element portions, respectively; reference numeral 102 and reference symbols T11 to T33 designate transferring TFT portions, respectively; reference numeral 104 and reference symbols Vg1 to Vg3 designate transferring TFT driving wirings, respectively; reference numeral 106 and reference symbols Sig1 to Sig3, signal lines; reference numeral 107 and reference symbols Vs1 to Vs3, photoelectric conversion element biasing wirings; reference symbol A, a signal processing circuit; reference symbol B, a bias power source; reference symbol D, a TFT driving circuit; and C, an A/D converter.

Radiation such as X-rays is made incident from an upper side in the paper of FIG. 11 to be converted into light such as visible light by a phosphor (not shown). The resultant light is then converted into electric charges by the photoelectric conversion elements S11 to S33 to be accumulated in the photoelectric conversion elements S11 to S33. Thereafter, the transferring TFT portions T11 to T33 are operated by the TFT driving circuit D through the TFT driving wirings so that these accumulated electric charges are transferred to the signal lines Sig1 to Sig3 to be processed in the signal processing circuit A. Moreover, the resultant signal is then subjected to A/D conversion in the A/D conversion unit C to be outputted.

Basically, the element structure as described above is generally adopted. In particular, as for the above-mentioned photoelectric conversion element, a PIN type photo detector (hereinafter referred to as "a PIN type PD" for short when applicable), or an MIS type photo detector (hereinafter referred to as "an MIS type PD" for short) adopted by the present inventors or the like is generally used. In addition to such elements, various kinds of elements have been proposed.

As described above, commercialization of the FPD has been attained. On the other hand, various proposals for the FPD have been made for the purpose of aiming at further enhancing the sensitivity. For example, in a report made in a literature of L. E Antonuk et al.: "SPIE Medical Imaging VI", February, pp. 23 to 27, 1992, there is disclosed a structure in which a sensor element is laminated on a TFT element. In this proposal, adoption of the above-mentioned structure allows an open area ratio of the sensor element to be increased to make enhancement of sensitivity possible. In addition, it is described that since the TFT element is disposed right under the sensor element, an unnecessary parasitic capacity is formed, and hence a grounded plane is disposed. However, specific details are unclear, and so are effects thereof.

In addition, in a proposal made in a literature of the specification in U.S. Pat. No. 5,498,880, likewise, there is shown a structure in which in order to increase an open area ratio, a sensor element is laminated on a TFT element. In this proposal, there is adopted the structure in which an electrode connected to a source/drain electrode of the TFT element covers the TFT element, and also becomes a separate electrode of the sensor element.

On the other hand, in a proposal as well in a literature of Japanese Patent Application Laid-Open No. 2000-156522, there is shown a structure in which for the purpose of aiming at increasing an open area ratio, a sensor element is laminated above a TFT element. In this proposal, there is adopted the structure in which the sensor element is laminated over the TFT element through an interlayer film.

However, in the above-mentioned related art examples, there is adopted the structure such that the channel portion of the TFT suffers the fluctuation in electric potential in various forms. In addition, even in the description that a shielding layer is disposed, its structure is not concretely clear.

That is to say, in the FPD having the conventional lamination structure, the separate electrode of the sensor element acts as a back gate electrode of the TFT element. Thus, a problem such as generation of a leakage current of the TFT element is caused due to the fluctuation in electric potential of the separate electrode to cause degradation in image quality.

In a case where for example, an area having a large sensor output signal, and an area having a small sensor output signal are disposed adjacent to each other, such crosstalk as to blur a boundary between these areas appears. In addition, there is caused a problem that a sensor saturation output is decreased to reduce a dynamic range.

DISCLOSURE OF THE INVENTION

The present invention has been made in the light of the foregoing problems, and it is, therefore, an object of the present invention to make it possible that even when an electric potential of a separate electrode of a sensor element disposed above a TFT element fluctuates, the fluctuation in characteristics due to generation of a leakage current of the TFT element is suppressed to attain enhancement of sensitivity.

According to the present invention, there is provided a photoelectric converter in which a plurality of pixels each including a sensor element for converting incident light into an electrical signal, and a thin film transistor connected to the sensor element are disposed, the photoelectric converter being characterized in that an electrode of the sensor element connected to the thin film transistor is disposed above the thin film transistor, and the thin film transistor has a top gate type structure in which a semiconductor layer, a gate insulating layer, and a gate electrode layer are laminated in order on a substrate.

According to the present invention, the top gate structure is adopted for the TFT element to thereby obtain such a structure that a TFT channel portion is protected by a gate electrode without disposing a complicated shielding structure above the TFTs. As a result, it is possible to obtain stable TFT characteristics without turning ON any of the TFT elements due to the back gate effect caused by the fluctuation in electric potentials corresponding to outputs from the sensor electrodes. That is to say, it is possible to greatly improve image quality as well.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

BEST MODE FOR CARRYING OUT THE INVENTION

Embodiments of the present invention will hereinafter be described in detail with reference to the accompanying drawings.

EMBODIMENT 1

A photoelectric converter in which transferring TFT elements and resetting TFT elements are disposed in pixels, respectively, and a radiation image pickup device will now be described as Embodiment 1 of the present invention. Embodiment 1 relates to an indirect type radiation image pickup device in which a wavelength conversion unit for wavelength-converting radiation into light such as visible light is disposed above a photoelectric converter, and the resultant light is read out by the photoelectric converter. Either an MIS type PD or a PIN type PD may be used for the photoelectric conversion element of the photoelectric converter.

Figure 1:
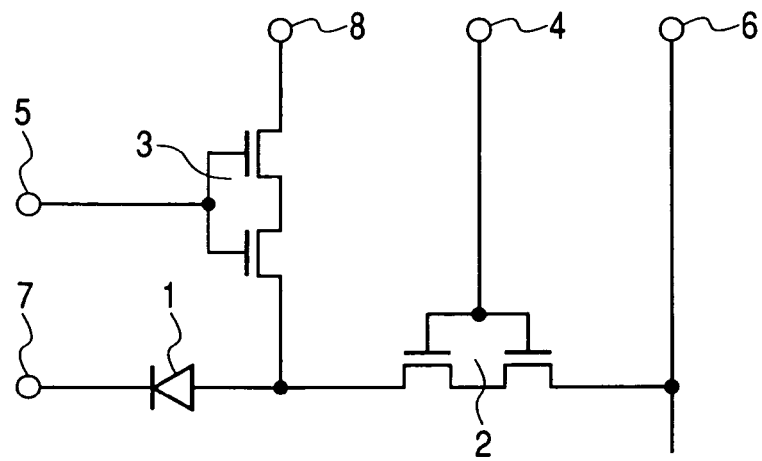
FIG. 1 is an equivalent circuit diagram of 1 bit in a radiation image pickup device according to Embodiment 1 of the present invention.

FIG. 1 shows an equivalent circuit diagram of 1 bit (one pixel) in the photoelectric converter. In the figure, reference numeral 1 designates a photoelectric conversion element portion; reference numeral 2 designates a transferring TFT portion; reference numeral 3 designates a resetting TFT portion; reference numeral 4 designates a transferring TFT driving wiring; reference numeral 5, a resetting TFT driving wiring; reference numeral 6, a signal line; reference numeral 7, a biasing wiring; and 8, a resetting wiring.

An outline of a driving method will hereinafter be described with reference to FIG. 1. Radiation such as X-rays is wavelength-converted by a wavelength conversion unit such as a phosphor to be made incident to the photoelectric conversion element portion 1. The incident light is then photoelectrically converted into electric charges which are in turn accumulated in the photoelectric conversion element portion 1.

Thereafter, an ON voltage is applied to gate electrodes of the transferring TFT portion 2 through the transferring TFT driving wiring 4 to turn ON the transferring TFT portion 2. As a result, an electrical signal is transferred from the photoelectric conversion element to the signal line 6 to be read out by a read IC which is separately provided. After completion of an operation for reading out the electrical signal, an OFF voltage is applied to the gate electrodes of the transferring TFT portion 2 through the transferring TFT driving wiring 4 to turn OFF the transferring TFT portion 2. Thus, a series of reading operations are completed.

Next, an ON voltage is applied to gate electrodes of the resetting TFT portion 3 through the resetting TFT driving wiring 5, and a reset voltage is applied to the resetting TFT portion 3 through the resetting wiring 8 to reset the photoelectric conversion element portion 1. Thereafter, an OFF voltage is applied to the gate electrodes of the resetting TFT portion 3 through the resetting TFT driving wiring 5 and the process ends.

Above, the driving method has been described on the basis of the equivalent circuit diagram of 1 bit for the sake of simplicity of description. In actual, however, pixels (each corresponding to 1 bit) are disposed in a two-dimensional manner, and transferring TFTs and resetting TFT portions of the pixels are connected to common drive wirings, respectively. Also, these elements of the pixels are commonly connected to corresponding signal lines and the like, respectively.

Figure 2:
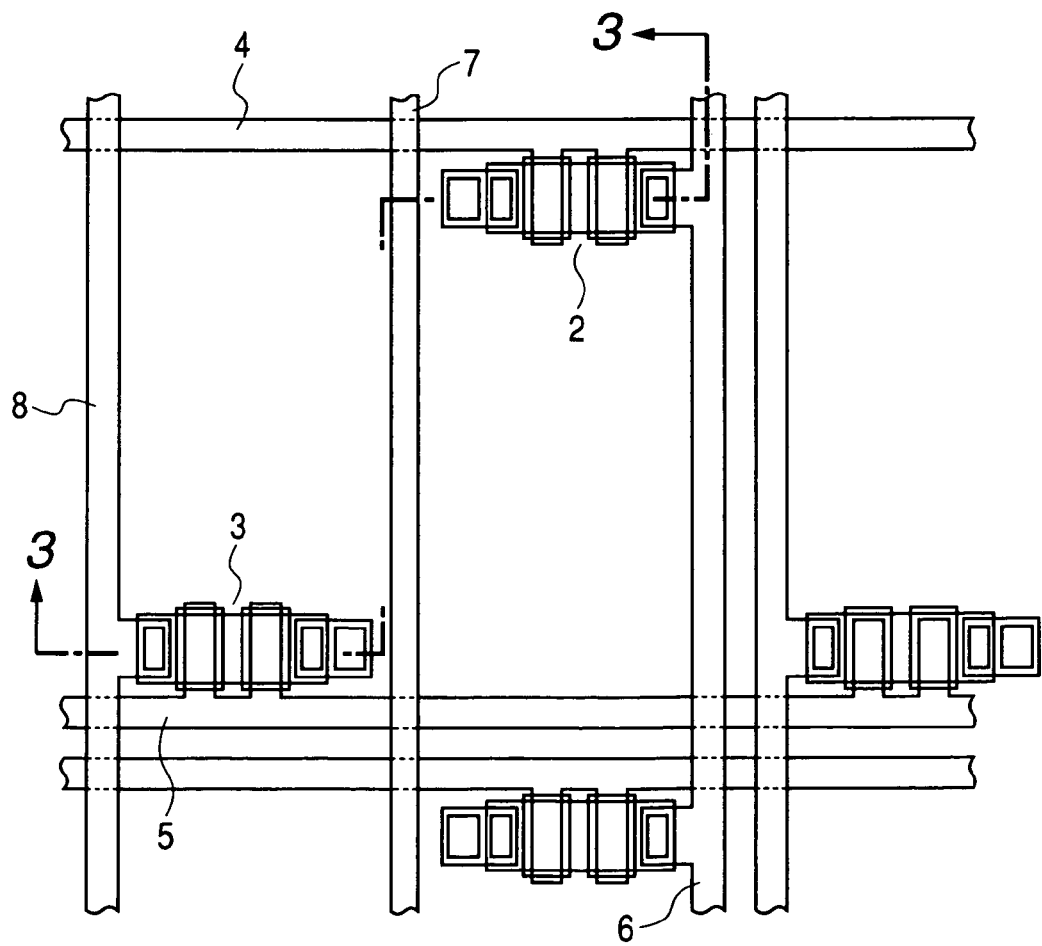
FIG. 2 is a schematic plan view of the radiation image pickup device according to Embodiment 1 of the present invention.
Figure 3:
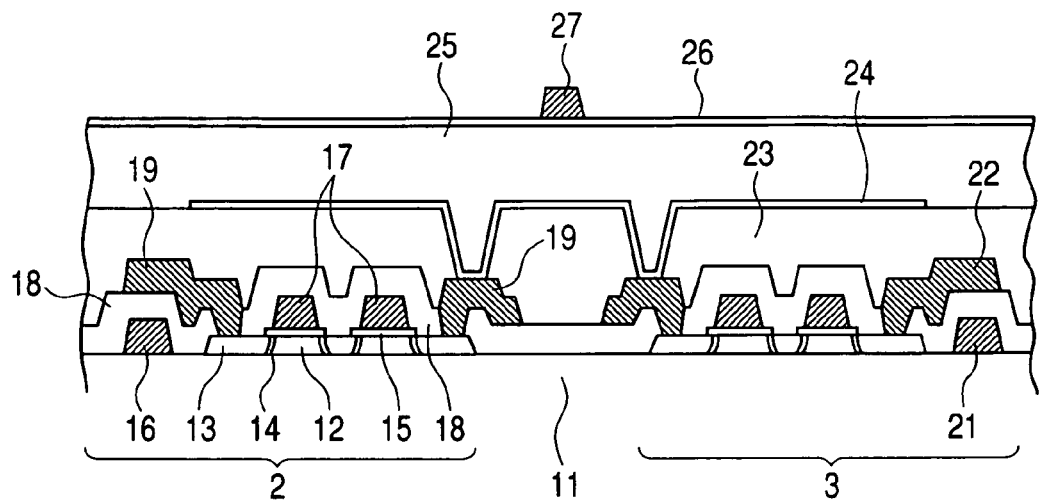
FIG. 3 is a schematic cross sectional view taken along line 3-3 of FIG. 2.

A schematic plan view of one pixel is shown in FIG. 2. In FIG. 2, the same constituent elements as those shown in FIG. 1 are designated with the same reference numerals. FIG. 3 is a cross sectional view taken along line 3-3 of FIG. 2. Note that, in FIG. 3, an interval between the transferring TFT portion 2 and the resetting TFT portion 3 is apparently shrunk.

First of all, the transferring TFT portion 2 will now be described. In FIG. 3, reference numeral 11 designates a substrate; reference numeral 12 designates a polycrystalline semiconductor layer; reference numeral 13 designates a source/drain region; reference numeral 14 designates an offset region constituted by a low impurity doped region having the same conductivity type as that of the source/drain region 13; reference numeral 15 designates a gate insulating layer; reference numeral 16, a transferring TFT gate driving wiring; reference numeral 17, a gate electrode; reference numeral 18, an interlayer insulating layer; and 19, a source/drain electrode. The transferring TFT portion 2 includes two TFTs connected in series with each other, and the two gate electrode 17 of the two TFTs are both commonly connected to the transferring TFT driving wiring 4. Also, each TFT has an LDD (Lightly Doped Drain) structure.

The resetting TFT portion 3 is formed so as to have the same structure as that of the transferring TFT portion 2. Reference numeral 21 designates a resetting TFT gate driving wiring, and reference numeral 22 designates a resetting wiring. The resetting TFT portion 3 also includes two TFTs connected in series with each other. Two gate electrodes of the two TFTs are both commonly connected to the resetting TFT driving wiring 5. Each TFT has the LDD structure.

In addition, in FIG. 3, reference numeral 23 designates an interlayer insulating layer; reference numeral 24 designates a sensor separate electrode; reference numeral 25 designates an MIS type PD (having a lamination structure in which an insulating layer, a semiconductor layer, and an ohmic contact layer are laminated); reference numeral 26, a transparent electrode; and 27, a sensor biasing wiring. An electrical signal from the MIS type PD 25 is transferred to the drain electrode 19 connected to the sensor separate electrode 24 to be read out from the signal line 6 connected to the source electrode 19 through the transferring TFT portion 2.

Note that, a phosphor (not shown) is disposed above the photoelectric conversion element portion (corresponding to the MIS type PD in Embodiment 1) and constitutes the radiation image pickup device. With adoption of the constitution as described above, there is provided a structure in which channel portions of the respective TFTs are shielded by the respective gate electrodes against the fluctuation in electric potential of the sensor separate electrode 24 connected to the MIS type PD.

It should be noted that any one of the transferring TFT portion and the resetting TFT portion may also be structured so as to include two TFTs connected in series with each other.

As a result, for example, it is possible to reduce a leakage current of each TFT corresponding to an optical output from the sensor separate electrode 24. Thus, image quality can be particularly enhanced. In addition, an open area ratio of about 100% is attained irrespective of a pixel size, and hence an area occupied by the TFTs becomes large so as to go against scale down (shrink). However, the open area ratio can be ensured irrespective of this situation. This becomes a great advantage in terms of a structure.

Moreover, a plurality of TFTs are connected in series with one another, whereby TFT characteristics, especially, OFF characteristics are improved. In addition, redundancy can be provided for the device against a failure as well such as short-circuit caused between the upper and lower layers through the gate insulating layer, or short-circuit caused in the semiconductor layer.

EMBODIMENT 2

A radiation image pickup device in which transferring TFT elements and resetting TFT elements are disposed in pixels, respectively, will hereinafter be described as Embodiment 2 of the present invention. Embodiment 2 relates to a direct type radiation image pickup device for directly converting radiation into an electrical signal using a-Se or the like.

Figure 4:
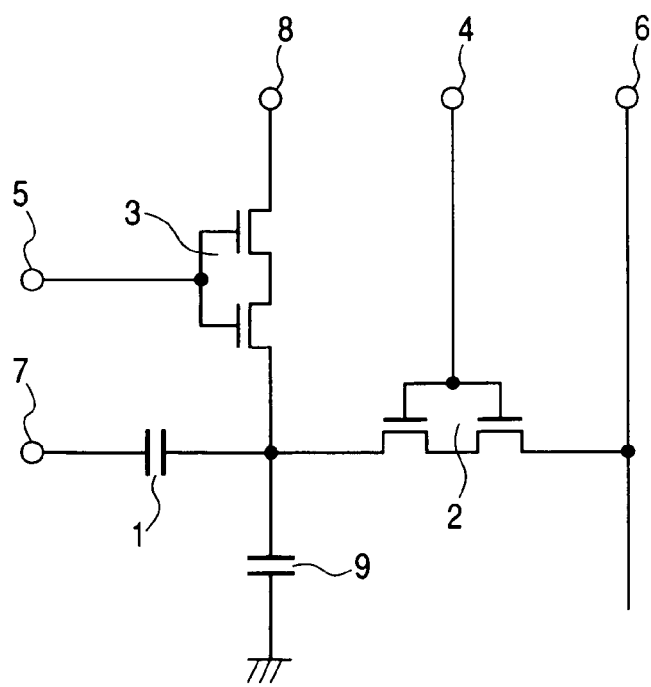
FIG. 4 is an equivalent circuit diagram of 1 bit in a radiation image pickup device according to Embodiment 2 of the present invention.

An equivalent circuit diagram of one bit is shown in FIG. 4. The same constituent elements as those of FIG. 1 are designated with the same reference numerals. However, reference numeral 1 designates a radiation conversion element portion. In the figure, the radiation conversion element portion 1 is a direct type radiation conversion element portion for directly converting radiation into an electrical signal. Reference numeral 2 designates a transferring TFT portion; reference numeral 3 designates a resetting TFT portion; reference numeral 4 designates a transferring TFT driving wiring; reference numeral 5, a resetting TFT driving wiring; reference numeral 6, a signal wiring; reference numeral 7, a biasing wiring; and 8, a resetting wiring. Also, reference numeral 9 designates a storage capacitor for accumulating therein electric charges obtained through the direct conversion of radiation.

A basic operation is nearly the same as that of Embodiment 1. Radiation is directly converted into electric charges in the radiation conversion element portion 1. The resultant electric charges are then accumulated in the storage capacitor 9 to be read out by the transferring TFT portion 2. Thereafter, during a resetting operation, the radiation conversion element portion 1 (the direct type conversion member in Embodiment 2) and the storage capacitor 9 are simultaneously reset.

Figure 5:
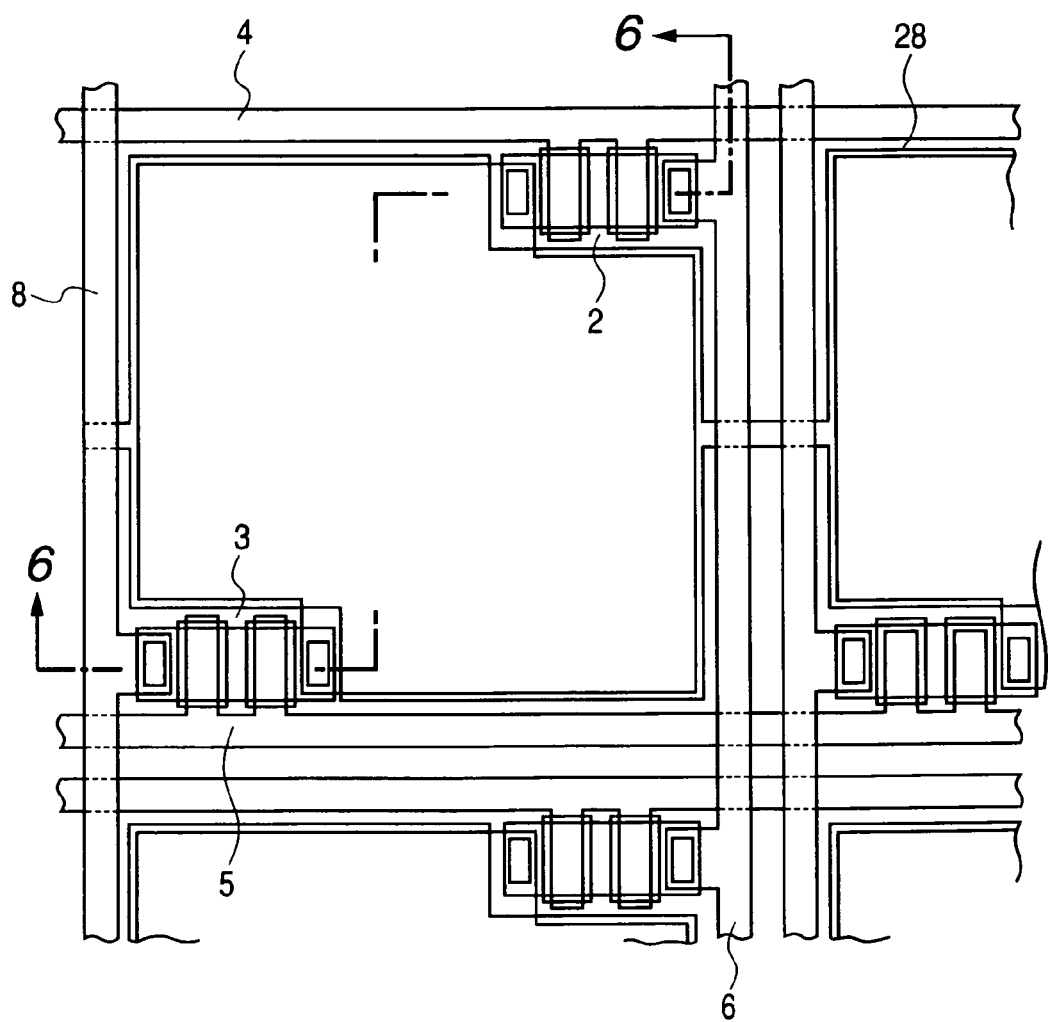
FIG. 5 is a schematic plan view of the radiation image pickup device according to Embodiment 2 of the present invention.
Figure 6:
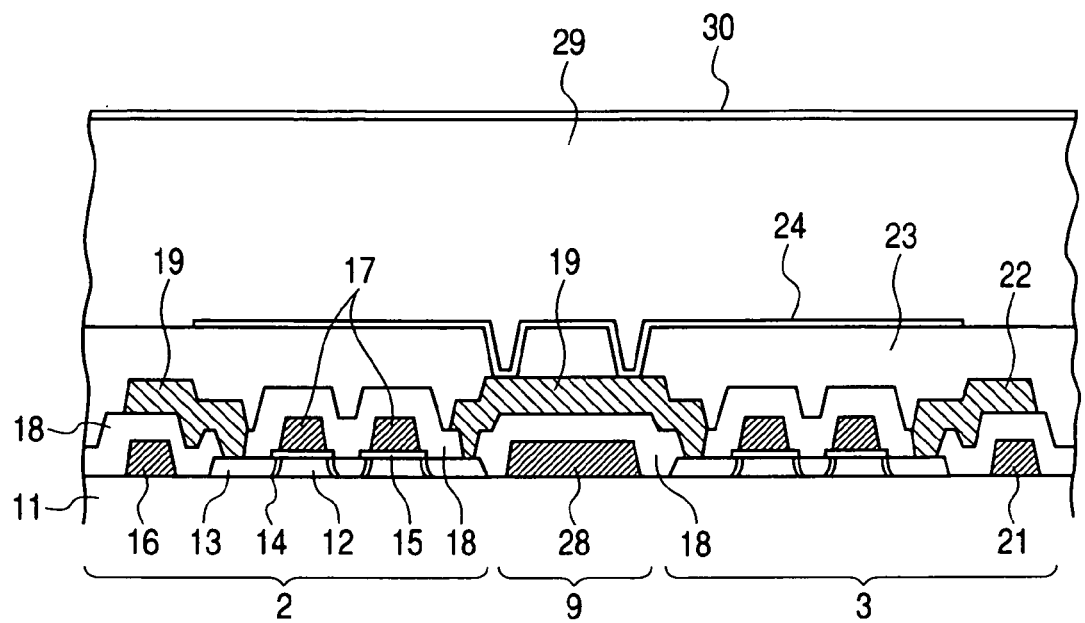
FIG. 6 is a schematic cross sectional view taken along line 6-6 of FIG. 5.

A schematic plan view of one pixel is shown in FIG. 5. In FIG. 5, the same constituent elements as those shown in FIG. 4 are designated with the same reference numerals. FIG. 6 is a cross sectional view taken along line 6-6 of FIG. 5. Note that, in FIG. 6, an interval between the transferring TFT portion 2 and the resetting TFT portion 3 is apparently shrunk.

First of all, the transferring TFT portion 2 will now be described. In FIG. 6, reference numeral 11 designates a substrate; reference numeral 12 designates a polycrystalline semiconductor layer; reference numeral 13 designates a source/drain region; reference numeral 14 designates an offset region constituted by a low impurity doped region having the same conductivity type as that of the source/drain region 13; reference numeral 15 designates a gate insulating layer; reference numeral 16, a transferring TFT gate driving wiring; reference numeral 17, a gate electrode; reference numeral 18, an interlayer insulating layer; and 19, a source/drain electrode. The transferring TFT portion 2 includes two TFTs connected in series with each other, and the two gate electrode 17 of the two TFTs are both commonly connected to the transferring TFT driving wiring 4. Also, each TFT has an LDD (Lightly Doped Drain) structure.

The resetting TFT portion 3 is formed so as to have the same structure as that of the transferring TFT portion 2. Reference numeral 21 designates a resetting TFT gate driving wiring, and reference numeral 22 designates a resetting wiring. The resetting TFT portion 3 also includes two TFTs connected in series with each other. Two gate electrodes of the two TFTs are both commonly connected to the resetting TFT driving wiring 5. Each TFT has the LDD structure.

In addition, in FIG. 6, reference numeral 23 designates an interlayer insulating layer; reference numeral 24 designates a sensor separate electrode; reference numeral 29 designates a direct conversion member (made of a-Se, GaAs, $PbI_2$ or the like); and reference numeral 30 designates a sensor upper electrode.

Also, the storage capacitor 9 is formed so as to include a capacitor lower electrode 28, the interlayer insulating layer 18, and the source/drain electrode 19.

Note that, similarly, with adoption of the constitution as described above, a structure is provided in which channel portions of the respective TFTs are shielded by the gate electrodes against the fluctuation in electric potential of the sensor separate electrode 24 connected to the direct conversion member 29.

As a result, for example, it is possible to reduce a leakage current of each TFT corresponding to an optical output from the sensor separate electrode 24. Thus, image quality can be particularly enhanced. In addition, an open area ratio of about 100% is attained irrespective of a pixel size. This becomes a great advantage in terms of a structure so as to go against scale down (shrink).

Moreover, a plurality of TFTs are connected in series with one another, whereby TFT characteristics, especially, OFF characteristics are improved. In addition, redundancy can be provided for the device against a failure as well such as short-circuit caused between the upper and lower layers through the gate insulating layer, or short-circuit caused in the semiconductor layer.

EMBODIMENT 3

A radiation image pickup device constituted by an AmpTFT (amplifying TFT) having a gate electrode for receiving electric charges generated in a photoelectric conversion element, a transferring TFT for transferring an electrical signal corresponding to these electric charges, and the like will hereinafter be described as Embodiment 3 of the present invention. Embodiment 3 relates to an indirect type radiation image pickup device for wavelength-converting radiation once into light such as visible light to read out the resultant light by photoelectric conversion elements. An MIS type PD or a PIN type PD may also be used for the photoelectric conversion element.

Figure 7:
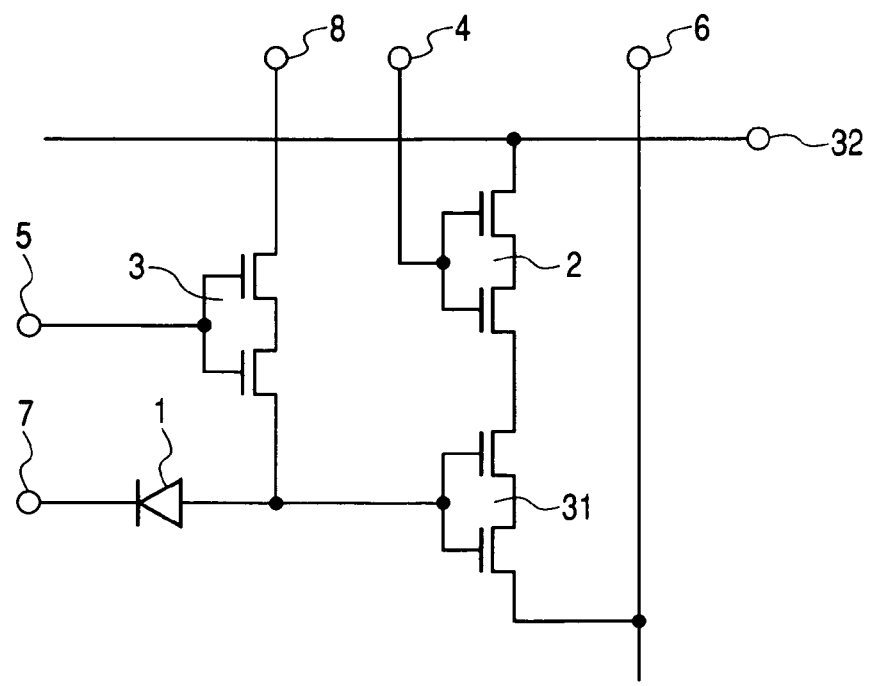
FIG. 7 is an equivalent circuit diagram of 1 bit in a radiation image pickup device according to Embodiment 3 of the present invention.

An equivalent circuit diagram of 1 bit in the photoelectric converter is shown in FIG. 7. In FIG. 7, the same constituent elements as those shown in FIG. 1 are designated with the same reference numerals. In the figure, reference numeral 1 designates a photoelectric conversion element portion; reference numeral 31 designates an AmpTFT portion; reference numeral 2 designates a transferring TFT; reference numeral 3 designates a resetting TFT portion; reference numeral 4 designates a transferring TFT driving wiring; reference numeral 5, a resetting TFT driving wiring; reference numeral 6, a signal line; reference numeral 7, a biasing wiring; reference numeral 8, a resetting wiring; and 32, a transferring TFT biasing wiring. The AmpTFT portion 31 also has two TFTs connected in series.

An outline of a driving method will hereinafter be described with reference to FIG. 7. Radiation such as X-rays is wavelength-converted by a wavelength conversion unit such as a phosphor to be made incident to the photoelectric conversion element portion 1. The incident light is then photoelectrically converted into electric charges which are in turn accumulated in the photoelectric conversion element portion 1.

Fluctuation in electric potential corresponding to a quantity of incident light is caused in a gate electrode of the AmpTFT 31 due to these electric charges. Thereafter, an ON voltage is applied to gate electrodes of the transferring TFT portion 2 through the transferring TFT driving wiring 4 to turn ON the transferring TFT portion 2. Thus, an output signal corresponding to a quantity of incident light is generated through the signal line 6.

After completion of an operation for reading the output by an outside IC, an OFF voltage is applied to the gate electrodes of the transferring TFT portion 2 through the transferring TFT driving wiring 4 to turn OFF the transferring TFT portion 2. Thus, a series of reading operations are completed.

Next, an ON voltage is applied to gate electrodes of the resetting TFT portion 3 through the resetting TFT driving wiring 5, and a reset voltage is applied to the resetting TFT portion 3 through the resetting wiring 8 to reset the photoelectric conversion element portion 1. Thereafter, an OFF voltage is applied to the gate electrodes of the resetting TFT portion 3 through the resetting TFT driving wiring 5 and the process ends.

Above, the driving method has been described on the basis of the equivalent circuit diagram of 1 bit for the sake of simplicity of description. In actual, however, pixels (each corresponding to 1 bit) are disposed in a two-dimensional manner, and transferring TFTs and resetting TFTs of the pixels are connected to common drive wirings, respectively. Also, these elements of the pixels are commonly connected to corresponding signal lines and the like, respectively.

Figure 8:
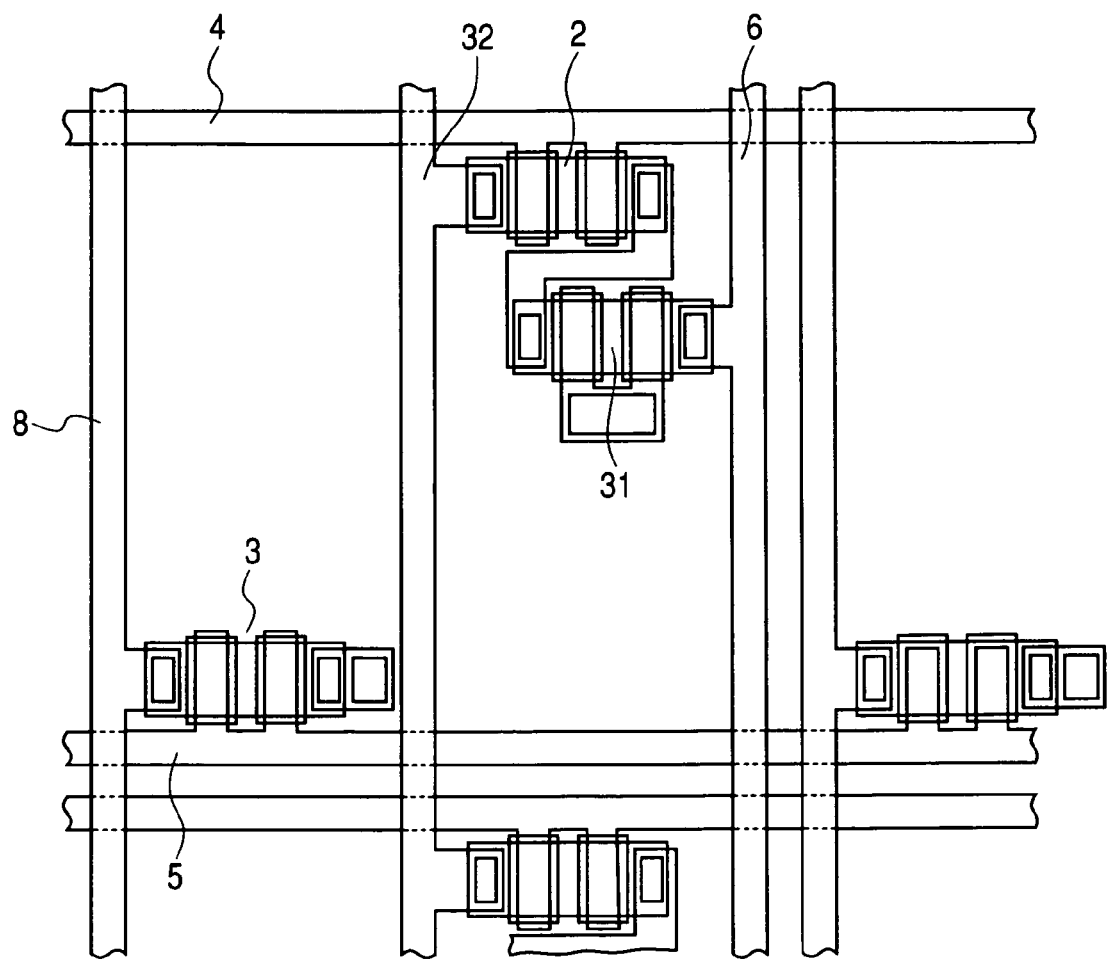
FIG. 8 is a schematic plan view of the radiation image pickup device according to Embodiment 3 of the present invention.

A schematic plan view of one pixel is shown in FIG. 8. In FIG. 8, the same constituent elements as those shown in FIGS. 1 and 7 are designated with the same reference numerals. In a case where three kinds of TFTs are used as in Embodiment 3, conventionally, since an open area ratio was remarkably reduced to make it impossible to ensure sufficient sensitivity, it was difficult to make a functional circuit design.

However, as in Embodiment 3, the sensor element is disposed above the TFT element, whereby it becomes possible to realize the radiation image pickup device having a high degree of freedom of a design. In other words, it becomes possible to realize the high-image quality device.

EMBODIMENT 4

Figure 9:
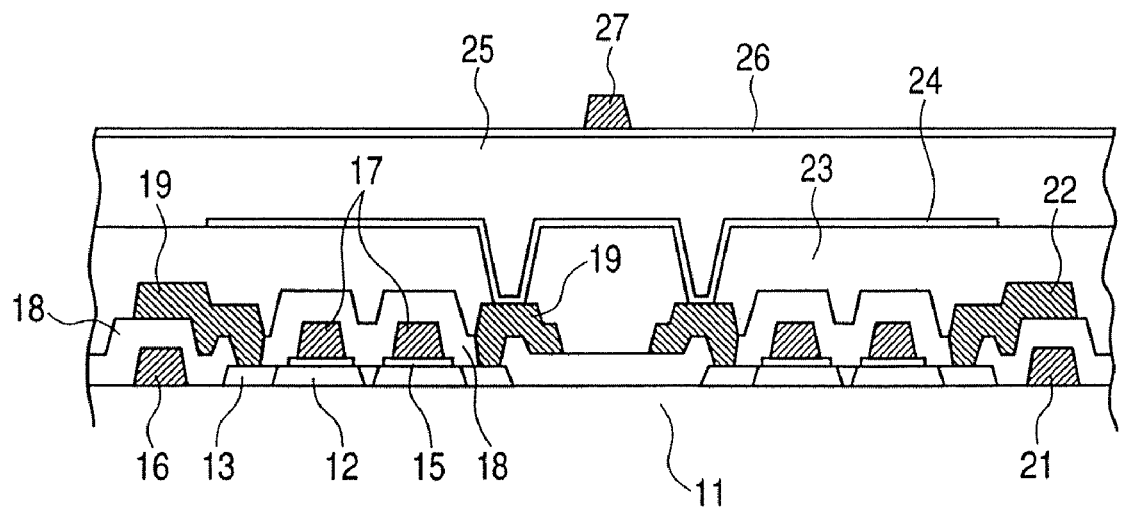
FIG. 9 is a schematic cross sectional view of a radiation image pickup device according to Embodiment 4 of the present invention.
Figure 10:
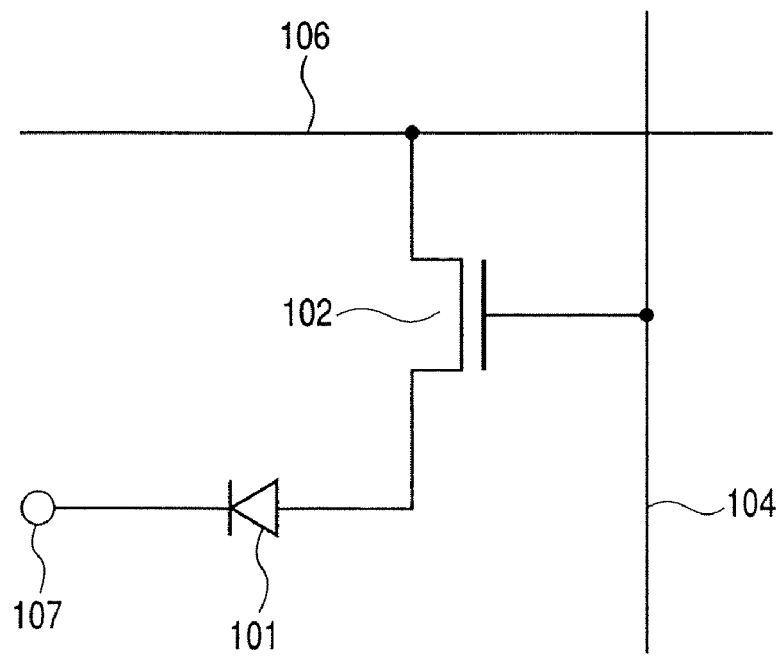
FIG. 10 is a schematic equivalent circuit diagram of 1 bit (one pixel) in a conventional radiation image pickup device.
Figure 11:
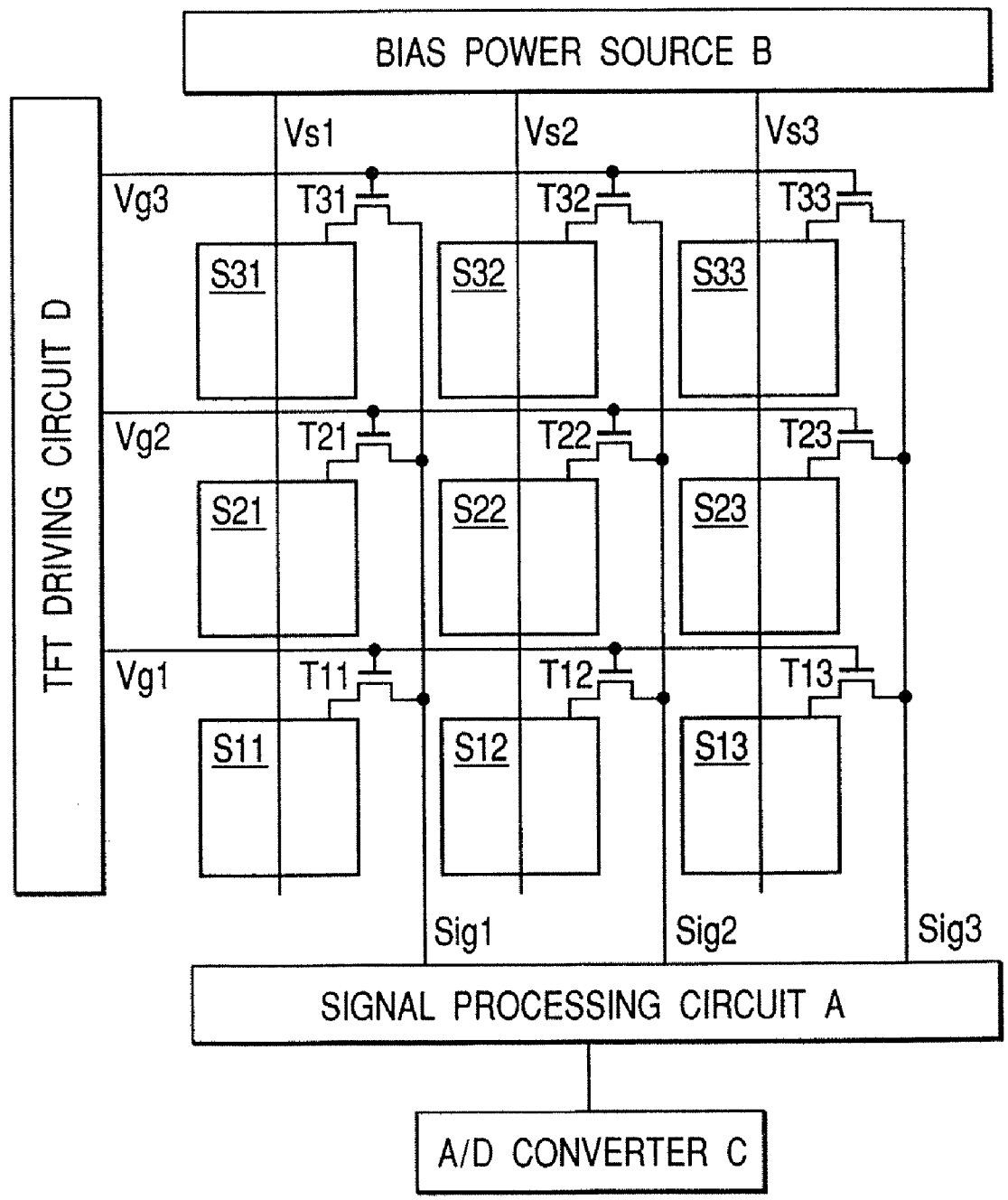
FIG. 11 is a schematic equivalent circuit diagram of (3×3) bits in the conventional radiation image pickup device.

In Embodiment 4, description will hereinafter be given with respect to a case where an offset structure is adopted for the TFT structure in Embodiment 1. A schematic cross sectional view of a radiation image pickup device according to Embodiment 4 is shown in FIG. 9.

As apparent from the figure, there is adopted the offset structure in which a channel region 12 is wider than a gate electrode 17 of a TFT. In case of Embodiment 4, similarly to the LDD structure adopted in Embodiment 1, the same effects are offered such as stabilization of the OFF-current in the TFT even in the offset structure.

EMBODIMENT 5

In Embodiment 5, the present invention is applied to an indirect type radiation image pickup device in which radiation such as X-rays which has been made incident is converted into visible light through a phosphor layer (wavelength conversion unit), and the resultant visible light is converted into electric charges by photoelectric conversion elements (semiconductor conversion elements or sensor elements), and the resultant electric charges are then read out through thin film transistors (switching elements).

Figure 12:
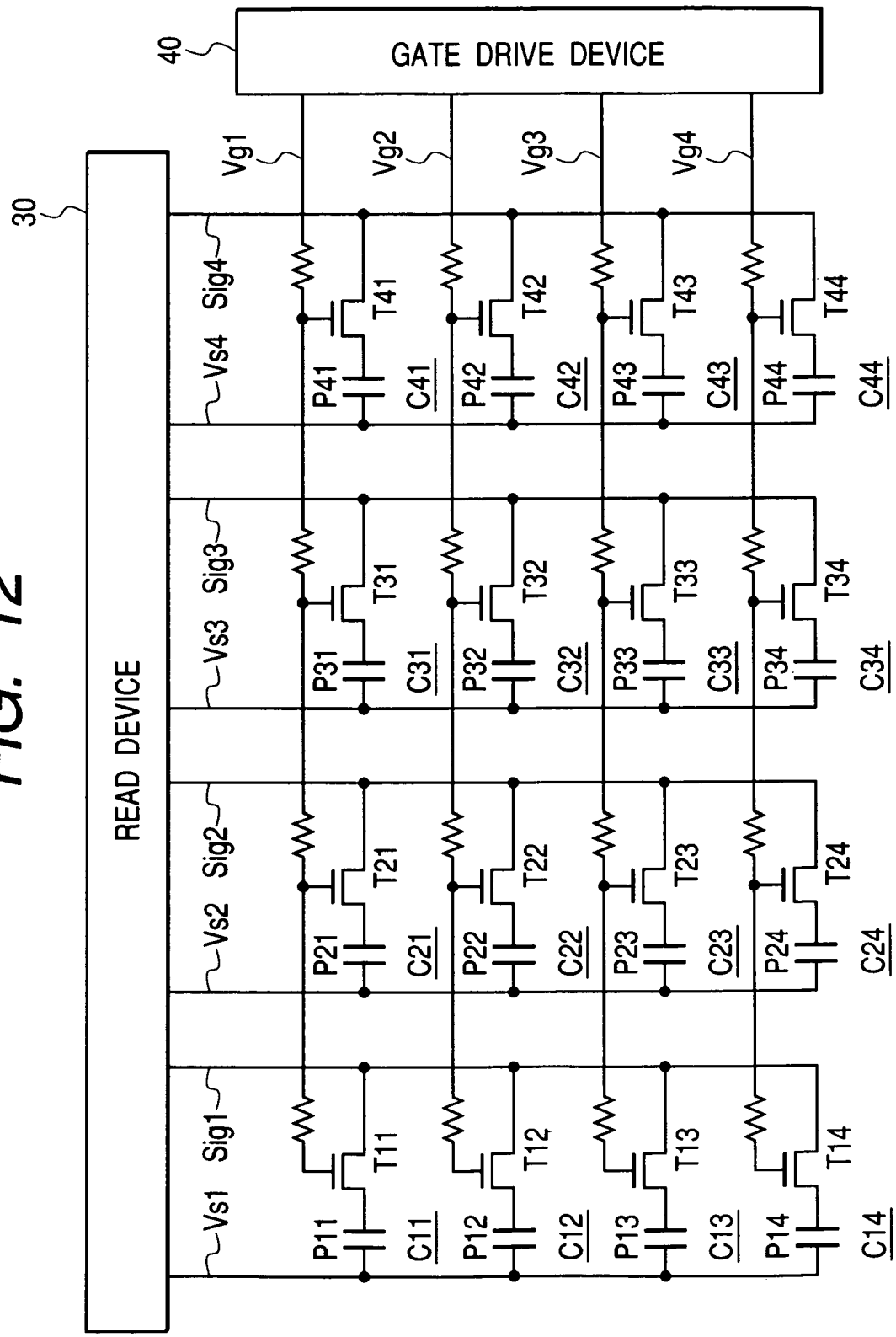
FIG. 12 is an equivalent circuit diagram of a radiation image pickup device according to Embodiment 5 of the present invention.
Figure 13:
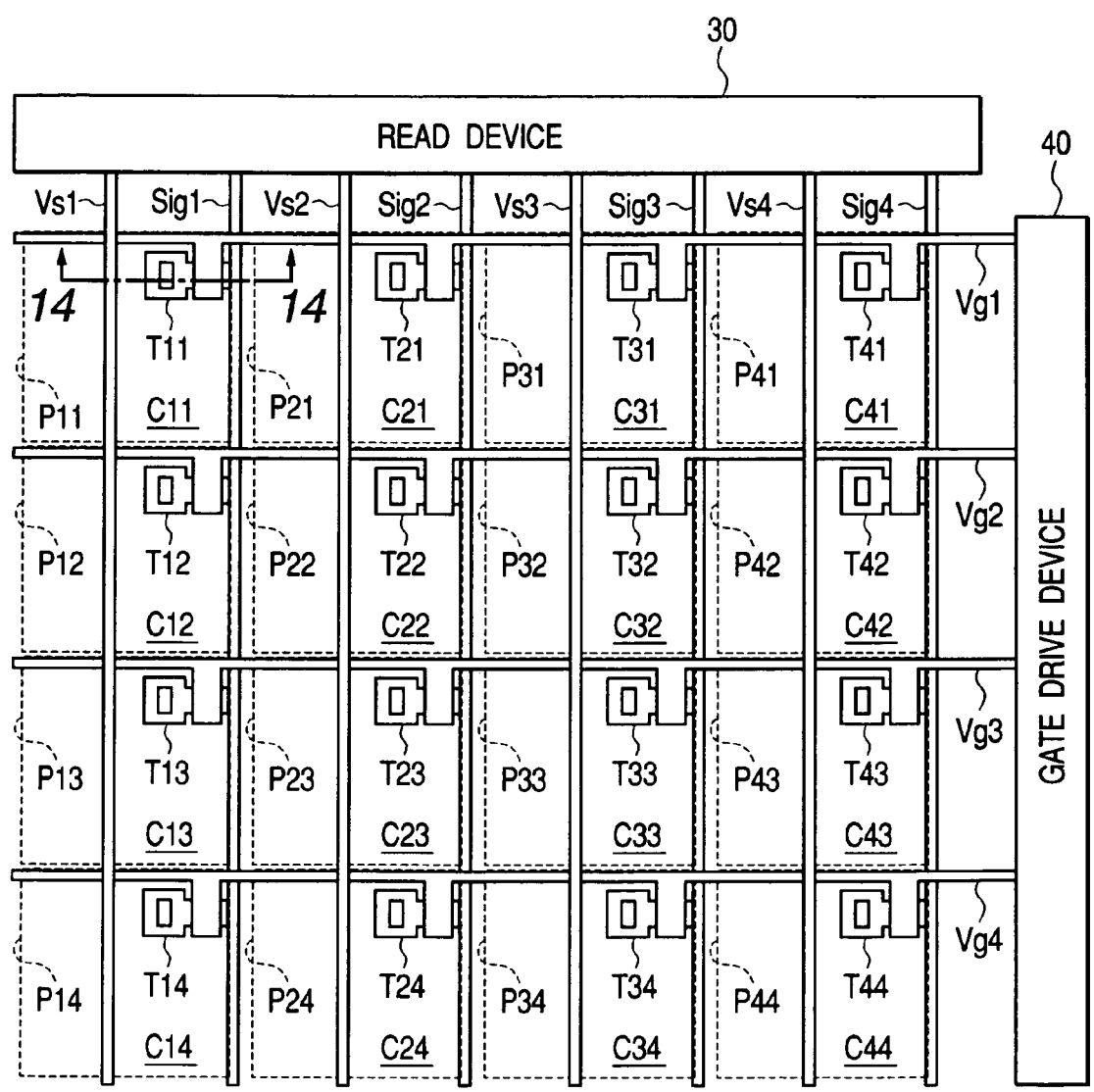
FIG. 13 is a schematic plan view of the radiation image pickup device according to Embodiment 5 of the present invention.
Figure 14:
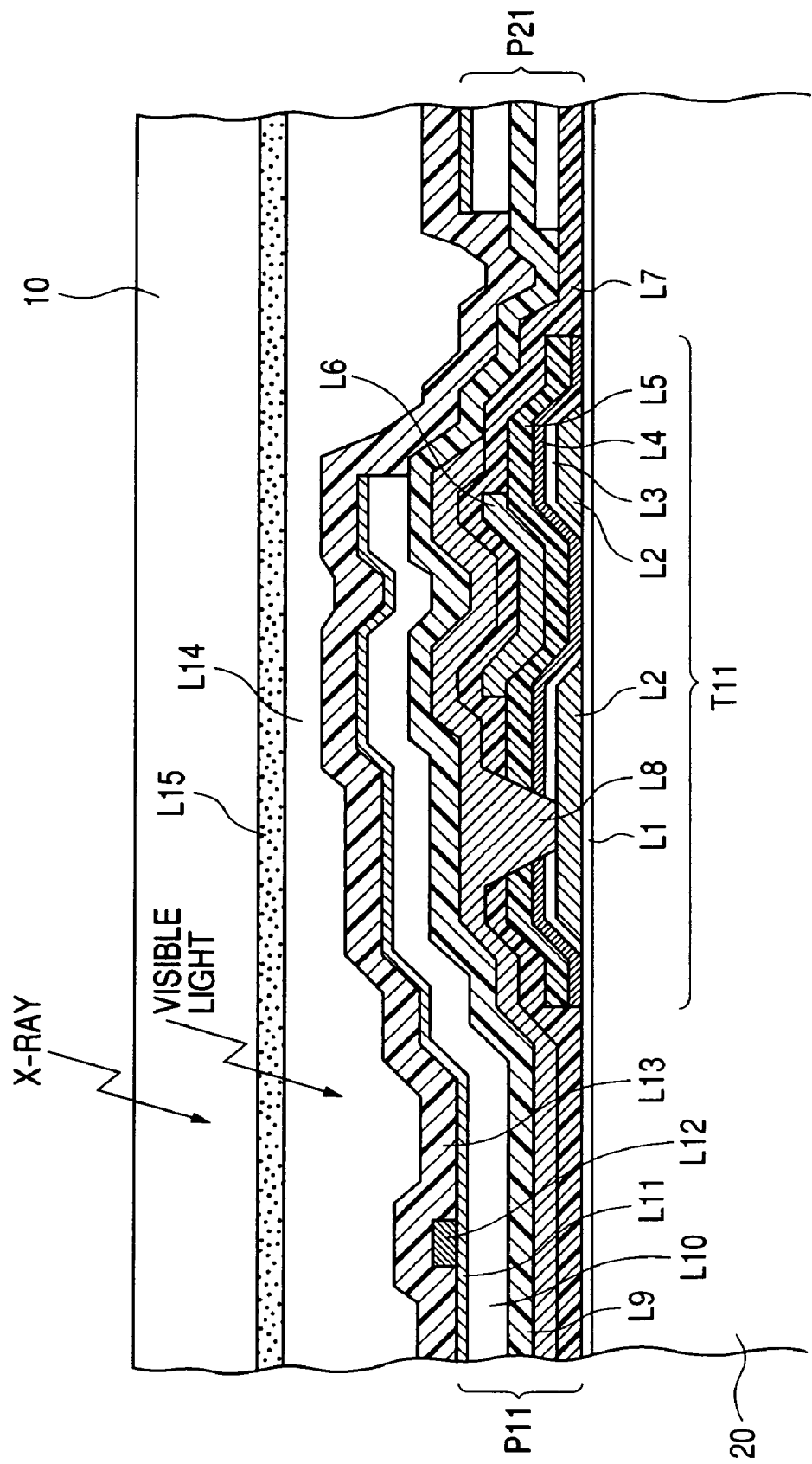
FIG. 14 is a schematic cross sectional view taken along line 14-14 of FIG. 13.

FIG. 12 is an equivalent circuit diagram of a radiation image pickup device according to Embodiment 5, FIG. 13 is a plan view of the radiation image pickup device according to Embodiment 5, and FIG. 14 is a cross sectional view of the radiation image pickup device according to Embodiment 5 (cross sectional view taken along line 14-14 of FIG. 13).

In FIGS. 12 to 14, reference symbols P11 to P44 (in FIG. 13, refer to an area surrounded by a dotted line) respectively designate photoelectric conversion elements as semiconductor conversion elements (sensor elements) which are formed below a phosphor layer 10 shown in FIG. 14 and which serve to convert visible light obtained through wavelength conversion for incident X-rays in the phosphor layer 10 into electric charges; and reference symbols T11 to T44 respectively designate thin film transistors (hereinafter referred to as "TFTs" for short) as switching elements for reading out the electric charges obtained through the photoelectric conversion in the photoelectric conversion elements P11 to P44. The photoelectric conversion elements P11 to P44, and the TFTs T11 to T44 constitute pixels C11 to C44, respectively. These pixels are formed in matrix on an insulating substrate 20 shown in FIG. 14. Note that, while the pixels disposed in matrix of 4×4 are shown in Embodiment 6, in actual, for example, the pixels are disposed in matrix of 1,000×2,000 on the insulating substrate 20 shown in FIG. 14.

As shown in FIGS. 12 and 13, the photoelectric conversion elements P11 to P44 are connected to common bias lines Vs1 to Vs4, respectively. A constant bias voltage is applied from a read device 30 to the photoelectric conversion elements P11 to P44 through the common bias lines Vs1 to Vs4.

Gate electrodes of the respective TFTs (T11 to T44) are connected to common gate lines Vg1 to Vg4, respectively. Turn-ON and Turn-OFF of the gate electrodes of the TFTs (T11 to T44) are controlled through the gate lines Vg1 to Vg4 by a gate drive device 40. Source and drain electrodes of the TFTs (T11 to T44) are connected to common signal lines Sig1 to Sig4, respectively. These signal lines Sig1 to Sig4 are connected to the read device 30.

In the above-mentioned radiation image pickup device, X-rays emitted towards a sample are attenuated and transmitted through the sample to be converted into visible light through the phosphor layer 10 shown in FIG. 14. This visible light is made incident to the photoelectric conversion elements P11 to P44 to be converted into electric charges. These electric charges are transferred to the signal lines Sig1 to Sig4 through the TFTs (T11 to T44) in accordance with a gate drive pulse applied from the gate drive device 40 to the gates of the TFTs (T11 to T44) to be read out to the outside by the read device 30. Thereafter, the electric charges, which have been generated in the photoelectric conversion elements P11 to P44 and have not been transferred to be still remaining, are removed by the common bias lines Vs1 to Vs4.

Here, structures of the above-mentioned elements will hereinafter be described with reference to FIG. 14. Here, while a structure of the pixel C11 shown in FIGS. 12 and 13 is now described as an example, each of other pixels C12 to C44 is identical in structure to the pixel C11.

As shown in FIG. 14, in the pixel C11, a first insulating layer L1, the TFT (T11), and the photoelectric conversion element P11 are formed in order on an insulating substrate 20.

For example, the first insulating layer L1 is formed of any one of SiN, $SiO_2$, and SiON.

As layers constituting the TFT (T11), as shown in FIG. 14, a first electrode layer L2 constituting source and drain electrodes, a high impurity doped semiconductor layer L3 including source and drain regions, a semiconductor layer L4 including a channel portion defined between the source and drain regions, a second insulating layer L5 constituting an insulating layer, and a second electrode layer L6 constituting a gate electrode are formed in this order on the first insulating layer L1. Of these layers, the second electrode layer L6 constituting the gate electrode is formed to be larger than a channel width of the semiconductor layer L4 so as to overlap in horizontal position the first electrode layer L2 which is formed below the second electrode layer L6 so as to sandwich the second insulating layer L5 with the second electrode layer L6 and which constitutes the source and drain electrodes. The first electrode layer L2, and the second electrode layer L6 are connected to the signal line Sig1 shown in FIGS. 12 and 13, and the gate line Vg1 shown in FIGS. 12 and 13, respectively.

Further, as layers constituting the photoelectric conversion element P11, as shown in FIG. 14, a third electrode layer L8, a fourth insulating layer L9, a second semiconductor layer L10, an $n^+$ type semiconductor layer L11, and a fourth electrode layer L12 connected to the common bias lines Vs1 to Vs4 are formed in this order above the second electrode layer L6 through a third insulating layer L7. Of these layers, the third electrode layer L8 is connected to the first electrode layer L2 of the TFT (T11). In addition, the fourth electrode layer L12 is connected to the biasing line Vs1 shown in FIGS. 12 and 13. As shown in FIG. 14, a fifth insulating layer L13 and an organic passivation layer L14 are formed in order over the fourth electrode layer L12. Also, the phosphor layer 10 is formed over the organic passivation layer L14 through an adhesion layer L15.

Consequently, even when the fluctuation in electric potential of the photoelectric conversion element P11 formed above the TFT (T11) is caused, the TFT characteristics are stabilized because the gate electrode for controlling turn-ON and turn-OFF of the TFT (T11) is present between the photoelectric conversion element P11 and a channel portion Ch11.

In addition, the TFT (T11) having such a structure becomes TFTs each having a high driving ability because after the high impurity doped semiconductor layer L3 is patterned, the semiconductor layer (first semiconductor layer L4) is formed to make it unnecessary to etch the channel portion Ch11 to allow the semiconductor layer to be formed of a thin film.

As described above, according to Embodiment 5, for each of the TFT elements (switching element) formed below the photoelectric conversion element (semiconductor conversion element), there is adopted the structure in which the source and drain electrodes (first electrode layer), the high impurity doped semiconductor layer, the semiconductor layer (first semiconductor layer), the insulating layer (second insulating layer), and the gate electrode (second electrode layer) are formed in this order. As a result, it is possible to form the TFT element having stable characteristics and a high driving ability.

It should be noted that while in Embodiment 5, the MIS type semiconductor conversion element has been described, even in case of a PIN type semiconductor conversion element, the same effects can be obtained.

In addition, in Embodiment 5, there has been exemplified the indirect type radiation image pickup device for converting radiation into visible light through the phosphor layer to convert the resultant visible light into electric charges by the photoelectric conversion elements. However, even when there is adopted a direct type radiation image pickup device using a material, such as amorphous selenium, capable of directly converting radiation into electric charges, the same effects can be obtained.

EMBODIMENT 6

In Embodiment 6, the present invention is applied to a radiation image pickup device in which, in addition to the same configuration as that in Embodiment 5, a resetting TFT is provided in each pixel.

Figure 15:
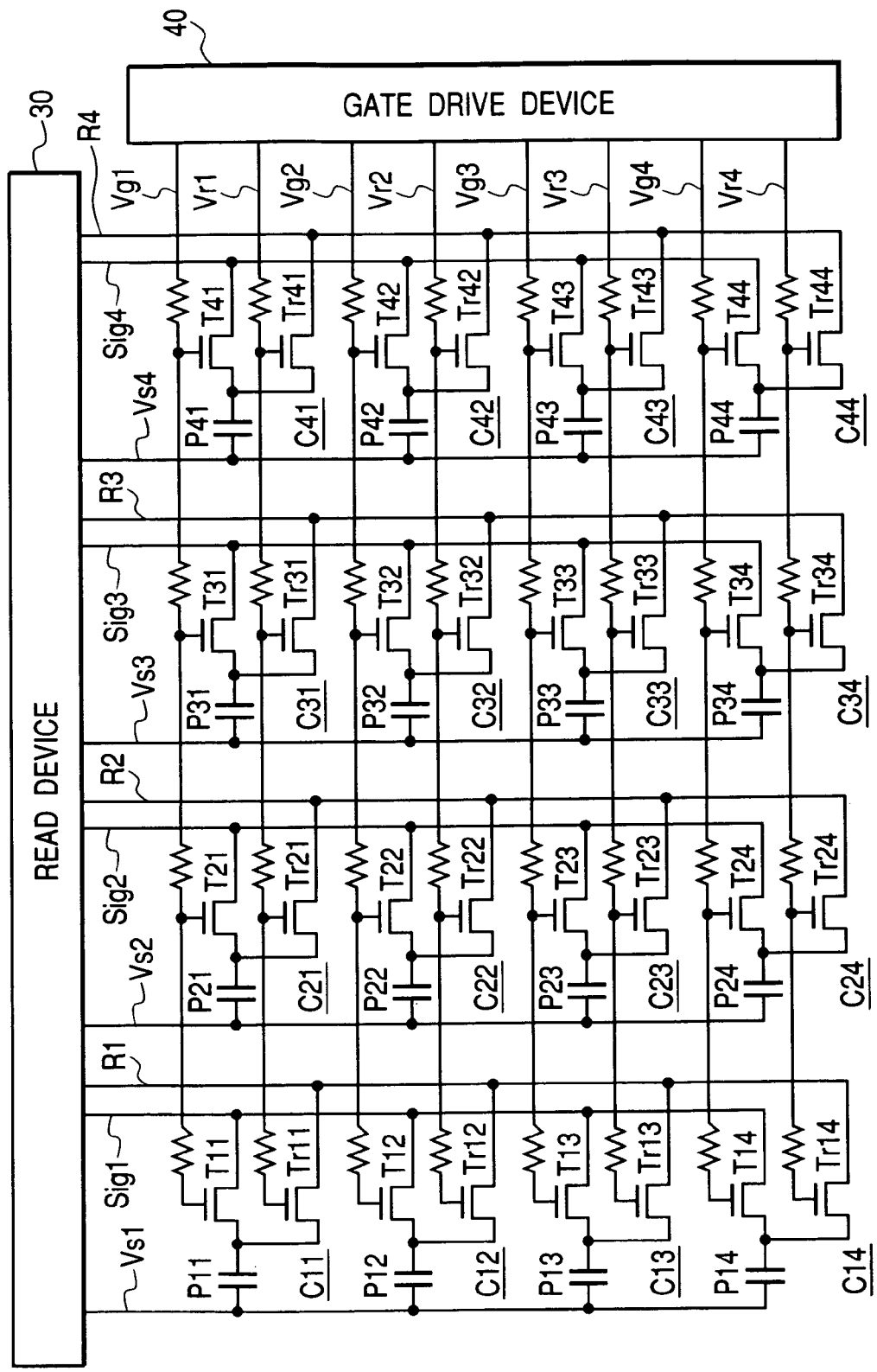
FIG. 15 is an equivalent circuit diagram of a radiation image pickup device according to Embodiment 6 of the present invention.
Figure 16:
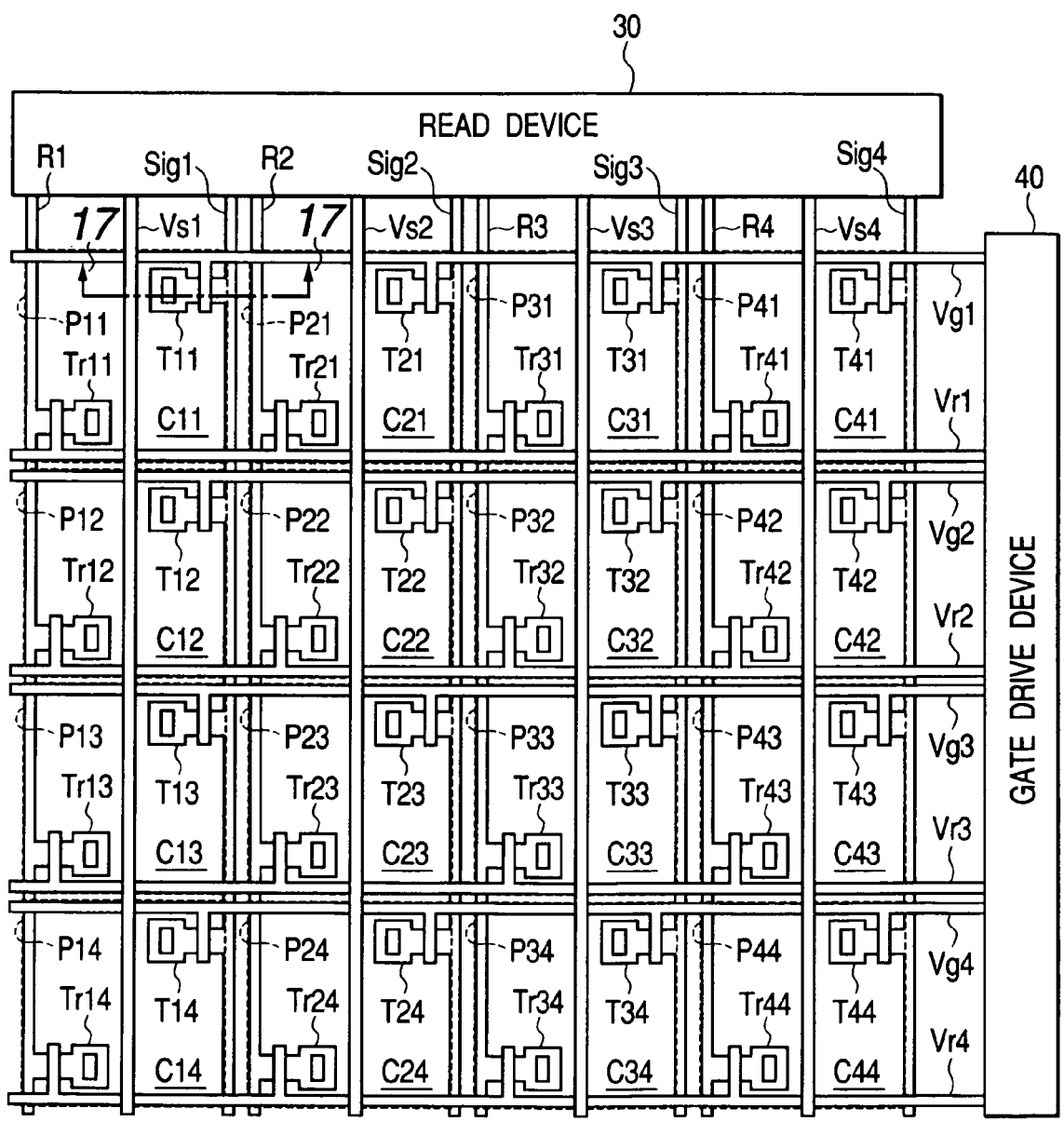
FIG. 16 is a schematic plan view of the radiation image pickup device according to Embodiment 6 of the present invention.
Figure 17:
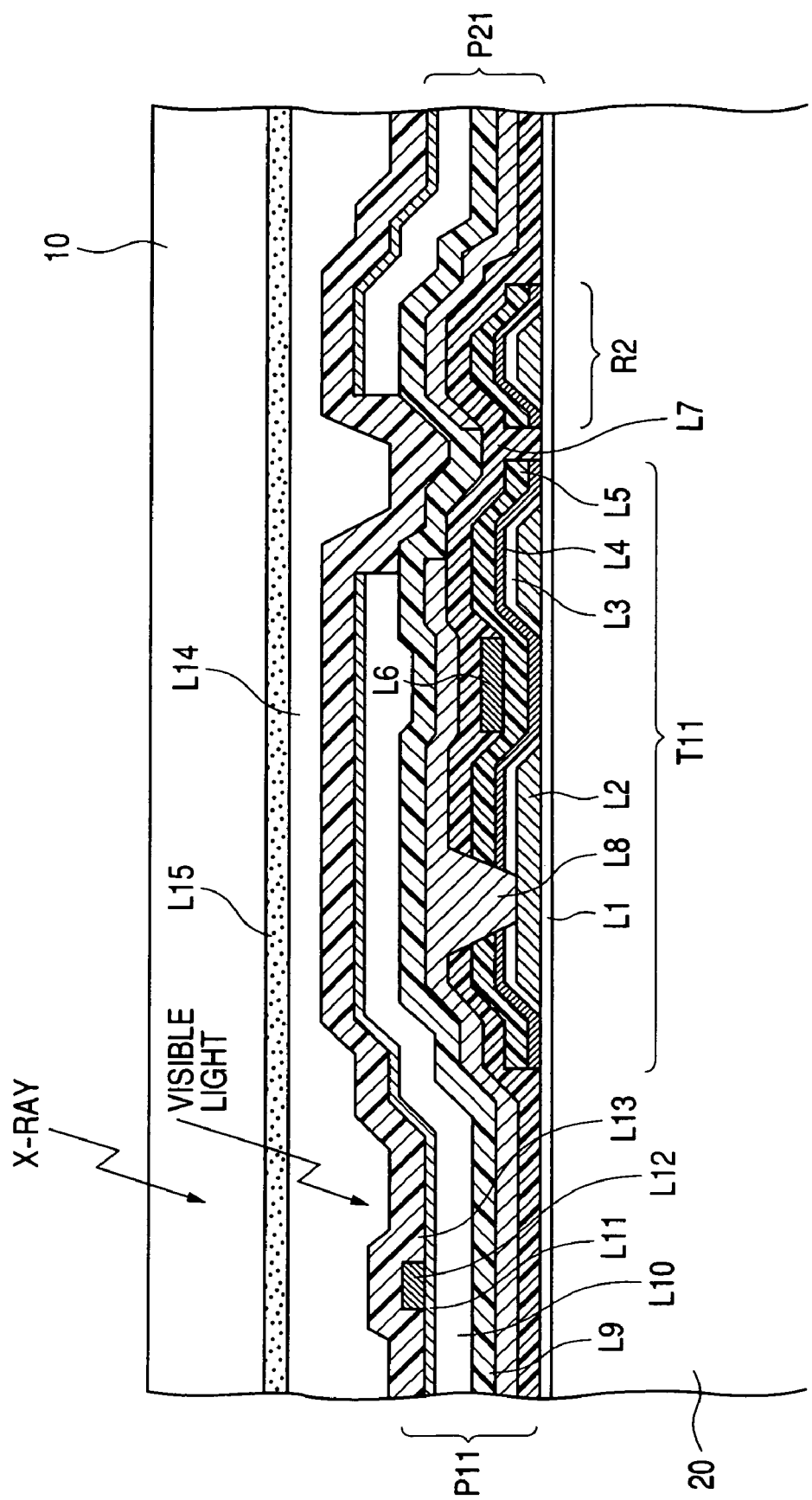
FIG. 17 is a schematic cross sectional view taken along line 17-17 of FIG. 16.

FIG. 15 is an equivalent circuit diagram of a radiation image pickup device according to Embodiment 6, FIG. 16 is a plan view of the radiation image pickup device according to Embodiment 6, and FIG. 17 is a cross sectional view of the radiation image pickup device according to Embodiment 6 (cross sectional view taken along line 17-17 of FIG. 16).

In FIGS. 15 to 17, reference symbols P11 to P44 (in FIG. 16, refer to an area surrounded by a dotted line) respectively designate photoelectric conversion elements as semiconductor conversion elements (sensor elements) which are formed below a phosphor layer 10 shown in FIG. 17 and which serve to convert visible light obtained through wavelength conversion for incident X-rays in the phosphor layer 10 into electric charges; reference symbols T11 to T44 respectively designate reading TFTs as switching elements for reading out the electric charges obtained through the photoelectric conversion in the photoelectric conversion elements P11 to P44; and reference symbols Tr11 to Tr44 respectively designate resetting TFTs for reading out the electric charges which are not transferred by the reading TFTs (T11 to T44) to be left and resetting the photoelectric conversion elements P11 to P44, respectively. The photoelectric conversion elements P11 to P44, the reading TFTs T11 to T44, and resetting TFTs Tr11 to Tr44 constitute pixels C11 to C44, respectively. These pixels are formed in matrix on an insulating substrate 20 shown in FIG. 17. Note that, while the pixels disposed in matrix of 4×4 are shown in Embodiment 6, in actual, the pixels are disposed in matrix of 1,000×2,000, for example, on the insulating substrate 20 shown in FIG. 17.

As shown in FIGS. 15 and 16, the photoelectric conversion elements P11 to P44 are connected to common bias lines Vs1 to Vs4, respectively. A constant bias voltage is applied from a read device 30 to the photoelectric conversion elements P11 to P44 through the common bias lines Vs1 to Vs4.

Gate electrodes of the reading TFTs (T11 to T44) are connected to common gate lines Vg1 to Vg4, respectively. Turn-ON and Turn-OFF of the gate electrodes of the reading TFTs (T11 to T44) are controlled through the gate lines Vg1 to Vg4 by a gate drive device 40. Source and drain electrodes of the reading TFTs (T11 to T44) are connected to common signal lines Sig1 to Sig4, respectively. These signal lines Sig1 to Sig4 are connected to the read device 30.

In addition, gate electrodes of the resetting TFTs (Tr11 to Tr44) are connected to common gate lines Vr1 to Vr4, respectively. Turn-ON and turn-OFF of the gate electrodes of the resetting TFTs (Tr11 to Tr44) are controlled through the gate lines Vr1 to Vr4 by the gate drive device 40. Source or drain electrodes of the resetting TFTs (Tr11 to Tr44) are connected to common resetting wirings R1 to R4, respectively. These resetting wirings R1 to R4 are connected to the read device 30.

In the above-mentioned radiation image pickup device, X-rays emitted towards a sample are attenuated and transmitted through the sample to be converted into visible light through the phosphor layer 10 shown in FIG. 17. This visible light is made incident to the photoelectric conversion elements P11 to P44 to be converted into electric charges. These electric charges are transferred to the signal lines Sig1 to Sig4 through the reading TFTs (T11 to T44) in accordance with a gate drive pulse applied from the gate drive device 40 to the gates of the reading TFTs (T11 to T44) to be read out to the outside by the read device 30. Thereafter, the electric charged, which have been generated in the photoelectric conversion elements P11 to P44 and have not been transferred by the reading TFTs (T11 to T44), are transferred to the resetting wirings R1 to R4 through the resetting TFTs (Tr11 to Tr44) to be removed by the read device 30.

Here, structures of the above-mentioned elements will hereinafter be described with reference to FIG. 17. Here, while a structure of the pixel C11 shown in FIGS. 15 and 16 is now described as an example, each of other pixels C12 to C44 is identical in structure to the pixel C11.

As shown in FIG. 17, in the pixel C11, a first insulating layer L1 made of any one of SiN, $SiO_2$, and SiON, the reading TFT (T11), the resetting TFT (not shown in FIG. 17), and the photoelectric conversion element P11 are formed in order on an insulating substrate 20.

Of the constituents mentioned above, in the reading TFT (T11), as shown in FIG. 17, a first electrode layer L2 constituting source and drain electrodes, a high impurity doped semiconductor layer L3 including source and drain regions, a semiconductor layer L4 including a channel portion defined between the source and drain regions, a second insulating layer L5 constituting an insulating layer, and a second electrode layer L6 constituting a gate electrode are formed in this order on the first insulating layer L1. Of these layers, the second electrode layer L6 constituting the gate electrode is formed only above the channel portion of the semiconductor layer L4 so as not to overlap in horizontal position the first electrode layer L2 which is formed below the second electrode layer L6 so as to sandwich the second insulating layer L5 with the second electrode layer L6 and which constitutes the source and drain electrodes. The first electrode layer L2, and the second electrode layer L6 are connected to the signal line Sig1 shown in FIGS. 15 and 16, and the gate line Vg1 shown in FIGS. 15 and 16, respectively.

The above-mentioned structure is also applied to the resetting TFT. In the schematic cross sectional view of FIG. 17, there is shown the resetting wiring R2 of the resetting TFT (Tr12) formed below the photoelectric conversion element P21 of the pixel C21 adjacent to the above-mentioned pixel C11. The resetting wiring R2 is connected to the first electrode layer (source or drain electrode) L2 of the resetting TFT (Tr12). Then, the high impurity doped semiconductor layer L3, the semiconductor layer L4, and the second insulating layer L5 are formed in order above the resetting wiring R2.

On the other hand, in the photoelectric conversion element P11, as shown in FIG. 17, a third electrode layer L8, a fourth insulating layer L9, a second semiconductor layer L10, an $n^+$ type semiconductor layer L11, and a fourth electrode layer L12 are formed in this order above the second electrode layer L6 through a third insulating layer L7. Of these layers, the third electrode layer L8 is connected to the source or drain electrode of the reading TFT (T11) constituted by the first electrode layer L2. In addition, the fourth electrode layer L12 is connected to the biasing line Vs1 shown in FIGS. 15 and 16. As shown in FIG. 17, a fifth insulating layer L13 and an organic passivation layer L14 are formed in order over the fourth electrode layer L12. Also, the phosphor layer 10 is formed over the organic passivation layer L14 through an adhesion layer L15.

Consequently, even when the fluctuation in electric potential of the photoelectric conversion element P11 formed above the reading TFT (T11) and the resetting TFT (Tr11) is caused, the TFT characteristics are stabilized because the gate electrode for controlling turn-ON and turn-OFF of the reading TFT (T11) and the resetting TFT (Tr11) is present between the photoelectric conversion element P11 and the channel portion Ch11.

In addition, the reading TFT and the resetting TFT each having such a structure become TFTs with a high driving ability because after the high impurity doped semiconductor layer is patterned, the semiconductor layer (first semiconductor layer) is formed to make it unnecessary to etch the channel portion. This allows the semiconductor layer to be formed of a thin film.

Moreover, in Embodiment 6, since the gate electrode of each of the reading TFT and the resetting TFT is formed only above the channel portion, the gate electrode does not overlap in horizontal position the source or drain electrode. As a result, the signal line capacity can be further reduced to make it possible to provide a low-noise radiation image pickup device.

As described above, according to Embodiment 6, for each of the TFT elements (the reading TFT and the resetting TFT) formed below the photoelectric conversion element (semiconductor conversion element), there is adopted the structure in which the source and drain electrodes (first electrode layer), the high impurity doped semiconductor layer, the semiconductor layer (first semiconductor layer), the insulating layer (second insulating layer), and the gate electrode (second electrode layer) are formed in this order. As a result, it is possible to form a TFT element having stable characteristics and a high driving ability.

It should be noted that while in Embodiment 6, the MIS type semiconductor conversion element has been described, even in case of a PIN type semiconductor conversion element, the same effects can be obtained.

In addition, in Embodiment 6, there has been exemplified the indirect type radiation image pickup device for converting radiation into visible light through the phosphor layer to convert the resultant visible light into electric charges by the photoelectric conversion elements. However, even when there is adopted a direct type radiation image pickup device using a material, such as amorphous selenium, capable of directly converting radiation into electric charges, the same effects can be obtained.

EMBODIMENT 7

Figure 18:
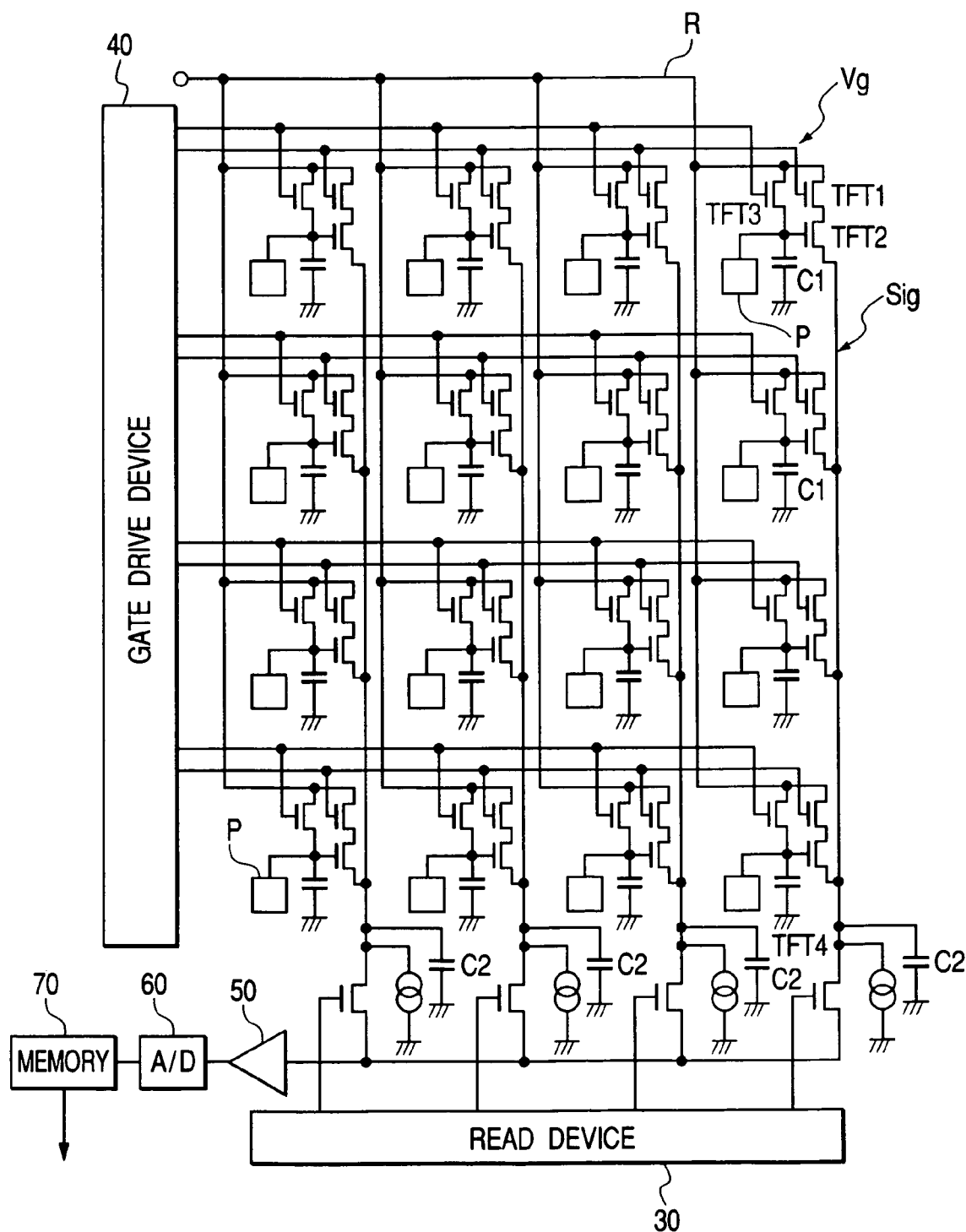
FIG. 18 is an equivalent circuit diagram of a radiation image pickup device according to Embodiment 7 of the present invention.

In Embodiment 7, the present invention is applied to a source follower (SFA) type radiation image pickup device. FIG. 18 is an equivalent circuit diagram of a radiation image pickup device according to Embodiment 7.

In the radiation image pickup device shown in FIG. 18, gate electrodes of the switching TFTs (TFT1 etc.) are connected to common gate lines Vg, respectively. Turn-ON and turn-OFF of the gates of the switching TFTs (TFT1 etc.) are controlled through the respective gate lines Vg by a gate drive device 40. Source or drain electrodes of the switching TFTs (TFT1 etc.) are connected to common signal lines Sig through reading TFTs (TFT2 etc.), respectively. The signal lines Sig are connected to a read device 30.

One electrodes of photoelectric conversion elements P are connected to common electrode drivers (not shown), respectively, and the other electrodes of the photoelectric conversion elements P are connected to control electrodes (gate electrodes) of the reading TFTs (TFT2 etc.), respectively.

Ones of source and drain electrodes of resetting TFTs (TFT3 etc.) are connected to gate electrodes of the reading TFTs (TFT2 etc.), respectively, and the others of the source and drain electrodes of the resetting TFTs (TFT3 etc.) are connected to the resetting wiring R.

In the above-mentioned radiation image pickup device, radiation which has been emitted towards a sample to be inspected is attenuated and transmitted through the sample to be converted into visible light through a phosphor layer (not shown in the figure). The resultant visible light is then made incident to photoelectric conversion elements P to be converted into electric charges. Fluctuation in electric potentials corresponding to irradiation quantities of light is caused in the gate electrodes of the reading TFTs (TFT2 etc.) due to generation of these electric charges.

Quantities of currents caused to flow through the reading TFTs (TFT2 etc.) are changed due to the fluctuation in electric potentials. The currents thus changed are transferred to the signal wirings Sig, respectively, to be read out to the outside through the TFTs (TFT4 etc.) provided in correspondence to the columns of the pixels, respectively, by the read device 30. The resultant signal is amplified by an amplifier 50 and then converted into a digital signal by an A/D converter 60 to be stored in a memory device 70. Thus, the digital signal can be outputted.

The switching TFTs (TFT1 etc.) are used as switches through which a voltage is applied across the sources and the drains of the reading TFTs (TFT2 etc.). In addition, after reading out a signal, the resetting TFTs (TFT3 etc.) are driven to apply a voltage to electrodes of the photoelectric conversion elements P which are connected to the resetting TFTs (TFT3 etc.) through the resetting wiring R, respectively, whereby it is possible to remove the electric charges accumulated in the photoelectric conversion elements P.

In case of the source follower type radiation image pickup device as described above, it is necessary to dispose a plurality of TFTs in one pixel area. Consequently, similarly to the related art examples, and Embodiments 1 and 2 as described above, it is desirable to form the photoelectric conversion elements above the TFTs for the purpose of enhancing an open area ratio.

Therefore, according to Embodiment 7 as well, in the same manner as in Embodiments 1 and 2 described above, for each of the TFT elements (TFTs 1 to 3), there is adopted the structure in which the source and drain electrodes (first electrode layer), the high impurity doped semiconductor layer, the semiconductor layer (first semiconductor layer), the insulating layer (second insulating layer), and the gate electrode (second electrode layer) are formed in this order. With this structure, the TFT element is formed having stable characteristics and a high driving ability.

APPLICATION EXAMPLE

Next, an application example of Embodiment 7 will hereinafter be described. In this application example, the radiation image pickup device of Embodiment 7 is applied to an X-ray image diagnosis system (radiation image pickup system) utilizing an X-ray digital radiography method. An example of this X-ray image diagnosis system is shown in FIG. 19.

Figure 19:
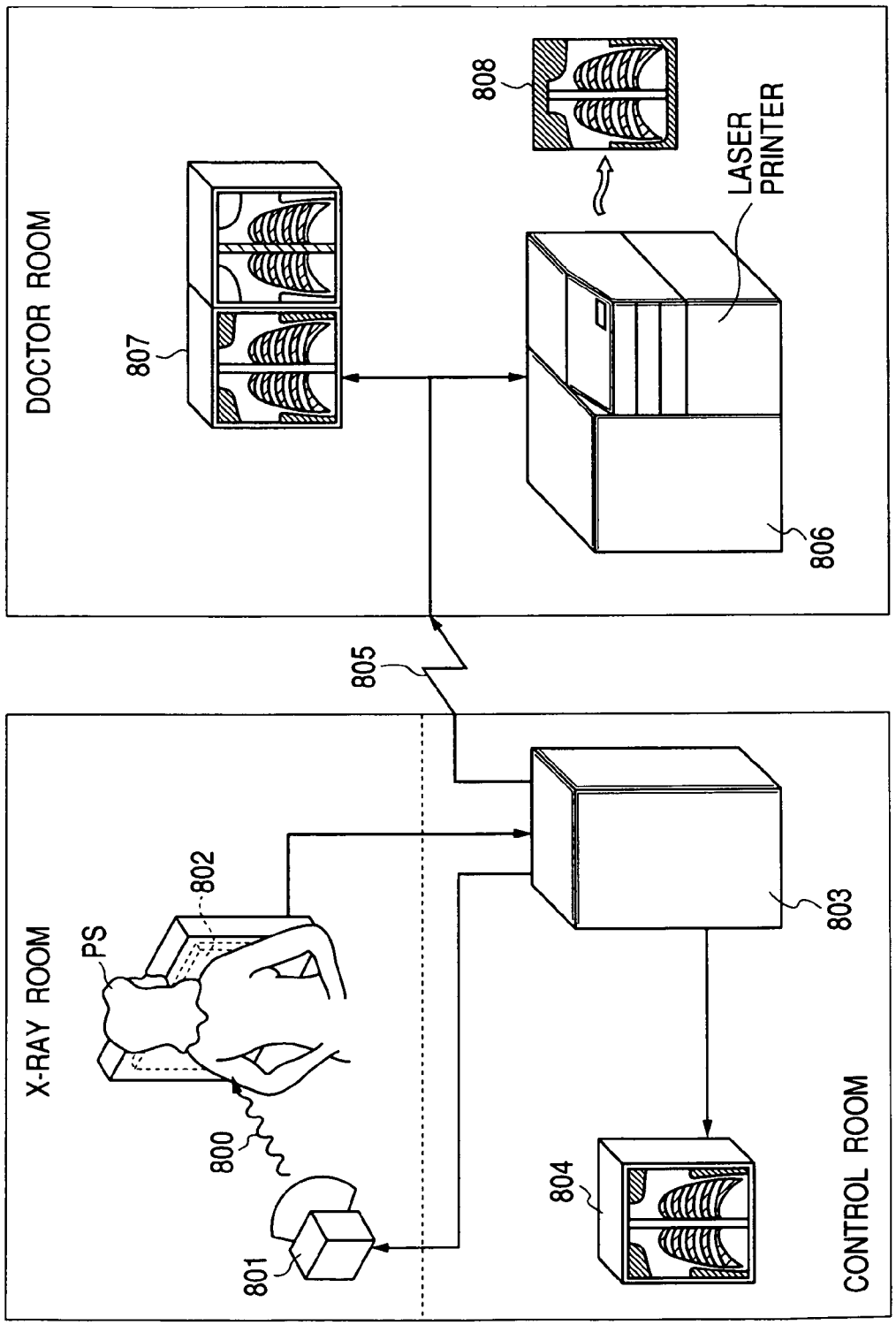
FIG. 19 is a conceptual view showing a configuration of an X-ray photograph system using the radiation image pickup device of the present invention.

The X-ray image diagnosis system shown in FIG. 19 is adapted to carry out an X-ray photograph of a sample (patient) to be inspected within an inspection room of medical facilities of a hospital or the like to image-process a resultant X-ray image if necessary to display the resultant image on a display device or to output the resultant image in the form of a film from a laser printer so that a doctor can observe and diagnose the X-ray image of the sample. This X-ray image diagnosis system, as its one example, includes a plurality of apparatuses, devices, units and the like which are separately installed in the rooms such as the inspection room (including an X-ray room and a control room), and a doctor room, respectively.

An X-ray tube (radiation source) 801 and an image sensor (radiation image pickup device) 802 are installed so as to face each other through a patient sample PS on the X-ray room side of the inspection room. Thus, during the X-ray photograph, X-rays 800 emitted from the X-ray tube 801 are transmitted through a part of the patient sample PS to be photographed to be made incident to the image sensor 802. As a result, in the image sensor 802, as has been described in the Embodiment 7, the incident X-rays are converted into an optical signal through the phosphor layer, and the resultant optical signal is then converted into electric charges in each photoelectric conversion element in each pixel. The resultant electric charges are then read out through the corresponding TFTs to be outputted in the form of an electrical signal to the outside. The resultant output signal corresponds to data which becomes the base of the X-ray image reflecting an X-ray absorption coefficient specific to the photographed part of the patient sample PS.

On the other hand, an image processor 803 connected to the X-ray tube 801 and the image sensor 802, and a display device 804 connected to the image processor 803 are installed on the control room side of the inspection room. Thus, during the X-ray photograph, in the image processor 803, in addition to various kinds of control operations for the photograph conditions and the like for the X-ray tube 801, various kinds of image processing for X-ray image data are executed for the electrical signal detected by the image sensor 802. The X-ray image of the patient sample PS obtained through such processing is then displayed on the display device 804.

In addition, a film processor 806 which is connected to the image processor 803 installed within the inspection room through a network 805 such as LAN (Local Area Network), and a display device 807 for a doctor connected to the film processor 806 are installed within the doctor room. Thus, the X-ray image data and the like obtained through the above-mentioned X-ray photograph are outputted in the form of a film 808 from the laser printer through the film processor 806, and are also displayed on the display device 807 for a doctor to be submitted for observation on the X-ray image and diagnosis.

It should be noted that the radiation image pickup device of each of the Embodiments 1 to 7 is not intended to be limited to the image sensor for use in the X-ray image diagnosis system of the above-mentioned application example, and hence can be applied to a radiation image pickup device or the like for use in other radiation image pickup systems.

While above, Embodiments of the present invention have been described, suitable Embodiment Modes of the present invention are described as follows.

EMBODIMENT MODE 1

A photoelectric converter in which a plurality of pixels each including a sensor element for converting incident light into an electrical signal, and a thin film transistor connected to the sensor element are disposed, in which an electrode of the sensor element connected to the thin film transistor is disposed above the thin film transistor, and the thin film transistor has a top gate type structure in which a semiconductor layer, a gate insulating layer, and a gate electrode layer are laminated in order on a substrate.

EMBODIMENT MODE 2

A photoelectric converter according to Embodiment Mode 1, in which the thin film transistors are constituted by a plurality of thin film transistors which are connected in series with one another and which use a same gate wiring.

EMBODIMENT MODE 3

A photoelectric converter according to Embodiment Mode 2, in which the plurality of thin film transistors include: a plurality of transferring thin film transistors for transferring electrical signals from the sensor elements, respectively; and a plurality of resetting thin film transistors for resetting the sensor elements, respectively.

EMBODIMENT MODE 4

A photoelectric converter according to Embodiment Mode 2, in which the plurality of thin film transistors include: a plurality of amplifying thin film transistors for receiving as their inputs electrical signals from the sensor elements, respectively; a plurality of transferring thin film transistors for outputting the electrical signals, respectively; and a plurality of resetting thin film transistors for resetting the sensor elements, respectively.

EMBODIMENT MODE 5

A photoelectric converter according to any one of Embodiment Modes 2 to 4, in which each of channel regions of the plurality of thin film transistors is wider than each of gate electrodes of the plurality of thin film transistors.

EMBODIMENT MODE 6

A radiation image pickup device, including: the photoelectric converter as claimed in any one of Embodiment Modes 1 to 5; and a conversion unit provided on a light incidence side of the photoelectric converter for converting radiation into light.

EMBODIMENT MODE 7

A radiation image pickup device in which a plurality of pixels each including a sensor element for converting radiation into an electrical signal, and a thin film transistor connected to the sensor element are disposed, characterized in that an electrode of the sensor element connected to the thin film transistor is disposed above the thin film transistor, and the thin film transistor has a top gate type structure in which a semiconductor layer, a gate insulating layer, and a gate electrode layer are laminated in order on a substrate.

EMBODIMENT MODE 8

A radiation image pickup device according to Embodiment Mode 7, in which the thin film transistors are constituted by a plurality of thin film transistors which are connected in series with one another and which use a same gate wiring.

EMBODIMENT MODE 9

A radiation image pickup device according to Embodiment Mode 7, in which a storage capacitor is connected to the sensor element.

EMBODIMENT MODE 10

A radiation image pickup device according to Embodiment Mode 8, in which the plurality of thin film transistors include: a plurality of transferring thin film transistors for transferring electrical signals from the sensor elements, respectively; and a plurality of resetting thin film transistors for resetting the sensor elements, respectively.

EMBODIMENT MODE 11

A radiation image pickup device according to Embodiment Mode 8, in which the plurality of thin film transistors include: a plurality of amplifying thin film transistors for receiving as their inputs electrical signals from the sensor elements, respectively; a plurality of transferring thin film transistors for outputting the electrical signals, respectively; and a plurality of resetting thin film transistors for resetting the sensor elements, respectively.

EMBODIMENT MODE 12

A radiation image pickup device according to any one of Embodiment Modes 8 to 11, in which each of channel regions of the plurality of thin film transistors is wider than each of gate electrodes of the plurality of thin film transistors.

EMBODIMENT MODE 13

A radiation image pickup device in which pixels including at least: a plurality of semiconductor conversion elements for converting radiation into electric charges; and a plurality of thin film transistors (TFTs) formed below the plurality of semiconductor conversion elements are disposed in matrix on an insulating substrate, in which the thin film transistor has source and drain electrodes, a high impurity doped semiconductor layer, a semiconductor layer, an insulating layer, and a gate electrode formed in this order on the insulating substrate.

EMBODIMENT MODE 14

A radiation image pickup device according to Embodiment Mode 13, in which the gate electrode of the thin film transistor is formed so as to overlap the source and drain electrodes.

EMBODIMENT MODE 15

A radiation image pickup device according to Embodiment Mode 13, in which the gate electrode of the thin film transistor is formed so as not to overlap the source and drain electrodes.

EMBODIMENT MODE 16

A radiation image pickup device according to Embodiment Mode 13, in which the source and drain electrodes of the thin film transistor are covered with the high impurity doped semiconductor layer.

EMBODIMENT MODE 17

A radiation image pickup device according to any one of Embodiment Modes 13 to 16, characterized in that an insulating layer is formed between the insulating substrate and the thin film transistors.

EMBODIMENT MODE 18

A radiation image pickup device according to Embodiment Mode 17, in which the insulating layer formed between the insulating substrate and the thin film transistors is made of any one of SiN, $SiO_2$, and SiON.

EMBODIMENT MODE 19

A radiation image pickup device in which pixels including: a wavelength conversion unit for wavelength-converting radiation; a plurality of semiconductor conversion elements for converting the wavelength-converted radiation into electric charges; and a plurality of thin film transistors formed below the semiconductor conversion elements are disposed in matrix on an insulating substrate, characterized in that the thin film transistor has source and drain electrodes, a high impurity doped semiconductor layer, a semiconductor layer, an insulating layer, and a gate electrode formed in this order on the insulating substrate.

EMBODIMENT MODE 20

A radiation image pickup system, characterized by including:

the radiation image pickup device according to any one of Embodiment Modes 6 to 19;

processing means for generating an image as an object for image pickup on the basis of electrical signals obtained from the radiation image pickup device; and display means for displaying the image generated by the processing means.

As set forth hereinabove, according to the present invention, it becomes possible to dispose the sensor elements above the TFTs without providing a special shielding structure. As a result, it is possible to ensure the sufficient open area ratio, i.e., the sensitivity even in case of shrink (scale down) of the pixel size due to the high definition. In addition, it becomes possible to prevent reduction of image quality due to generation of leakage currents of the TFTs.

As many apparently widely different embodiments of the present invention can be made without departing from the spirit and scope thereof, it is to be understood that the invention is not limited to the specific embodiments thereof except as defined in the claims.

The invention claimed is:

1. A photoelectric converter comprising a plurality of pixels each comprising a sensor element for converting incident light into an electrical signal and a plurality of thin film transistors electrically connected to the sensor element,
   wherein each of the plurality of thin film transistors has a top gate type structure in which a semiconductor layer, a gate insulating layer, and a gate electrode layer are laminated successively on a substrate, and an electrode of the sensor element electronically connected to the plurality of thin film transistors is disposed above the thin film transistor, and
   wherein the electrode of the sensor element covers each channel region of the plurality of thin film transistors, and each of the plurality of thin film transistors is constituted by a respective further plurality of thin film transistors which are connected in series with one another and which have gate electrodes that are connected electrically.

2. A photoelectric converter according to claim 1, wherein the plurality of thin film transistors electrically connected to the sensor element comprise: a transferring thin film transistor for transferring an electrical signal from the sensor element, a resetting thin film transistor for resetting the sensor element, the transferring thin film transistor having the gate electrodes of its further plurality of thin film transistors connected to the same gate wiring, and the resetting thin film transistor having the gate electrodes of its further plurality of thin film transistors connected to the same gate wiring.

3. A photoelectric converter according to claim 1, wherein the plurality of thin film transistors electrically connected to the sensor element comprise: an amplifying thin film transistor for receiving an electrical signal from the sensor element; a transferring thin film transistor for outputting the electrical signal; and a resetting thin film transistor for resetting the sensor element, the amplifying thin film transistor having the gate electrodes of its further plurality of thin film transistors connected to the electrode of the sensor element, the transferring thin film transistor having the gate electrodes of its further plurality of thin film transistors connected to the same gate wiring, and the resetting thin film transistor having the gate electrodes of its further plurality of thin film transistors connected to the same gate wiring.

4. A photoelectric converter according to claim 1, wherein the channel regions of the plurality of thin film transistors electrically connected to the sensor element are wider than the gate electrodes of those thin film transistors.

5. A radiation image pickup device, comprising: the photoelectric converter as claimed in claim 1; and a conversion unit provided on a light incidence side of the photoelectric converter for converting radiation into light.

6. A photoelectric converter according to claim 1, wherein the electrode of the sensor element covers the semiconductor layer of the plurality of thin film transistors.

7. A photoelectric converter according to claim 1, wherein two interlayer insulating layers are disposed between the electrode of the sensor element electrically connected to the plurality of thin film transistors and gate electrodes of the plurality of thin film transistors, and a single interlayer insulating layer is disposed between the electrode of the sensor element electrically connected to the plurality of thin film transistors and a wiring electrically connected to the plurality of thin film transistors.

8. A radiation image pickup device comprising a plurality of pixels each comprising a sensor element for convening radiation into an electrical signal and a plurality of thin film transistors electronically connected to the sensor element,
   wherein each of the plurality of thin film transistors has a top gate type structure in which a semiconductor layer, a gate insulating layer, and a gate electrode layer are laminated successively on a substrate, and an electrode of the sensor element electrically connected to the plurality of thin film transistors is disposed above the thin film transistors, and
   wherein the electrode of the sensor element covers each channel region of the plurality of thin film transistors, and each of the plurality of thin film transistors is constituted by respective further plurality of thin film transistors which are connected in series with one another and which have gate electrodes that are connected electrically.

9. A radiation image pickup device according to claim 8, wherein a storage capacitor is connected to the sensor element.

10. A radiation image pickup device according to claim 8, wherein the plurality of thin film transistors electrically connected to the sensor element comprise: a transferring thin film transistor for transferring an electrical signal from the sensor element; and a resetting thin film transistor for resetting the sensor element, the transferring thin film transistor having the gate electrodes of its plurality of thin film transistors connected to the same gate wiring, and the resetting thin film transistor having the gate electrodes of its plurality of thin film transistors connected to the same gate wiring.

11. A radiation image pickup device according to claim 8, wherein the plurality of thin film transistors electrically connected to the sensor element comprise:
   an amplifying thin film transistors transistor for receiving as its input an electrical signal from the sensor element;
   a transferring thin film transistor for outputting the electrical signal; and
   a resetting thin film transistor for resetting the sensor element, the amplifying thin film transistor having the gate electrodes of its plurality of thin film transistors connected to the electrode of the sensor element, the transferring thin film transistor having the gate electrodes of its plurality of thin film transistors connected to the same gate wiring, and the resetting thin film transistor having the gate electrodes of its plurality of thin film transistors connected to the same gate wiring.

12. A radiation image pickup device according to claim 8, wherein the channel regions of the plurality of thin film transistors electrically connected to the sensor element are wider than the gate electrodes of those thin film transistors.

13. A radiation image pickup system comprising:
   the radiation image pickup device as claimed in claim 5;
   processing means for generating an image as an object for image pickup on the basis of electrical signals obtained from the radiation image pickup device; and
   display means for displaying the image generated by the processing means.

14. A radiation image pickup system comprising: the radiation image pickup device as claimed in claim 8; processing means for generating an image as an object for image pickup on the basis of electrical signals obtained from the radiation image pickup device; and display means for displaying the image generated by the processing means.

* * * * *